(12) United States Patent
Gross et al.

(10) Patent No.: US 8,677,227 B2
(45) Date of Patent: Mar. 18, 2014

(54) METHOD AND SYSTEM FOR DECODING

(75) Inventors: Warren Gross, Montreal (CA); Saied Hemati, Montreal (CA); Shie Mannor, Montreal (CA); Ali Naderi, Montreal (CA); Francois Leduc-Primeau, Montreal (CA)

(73) Assignee: Royal Institution for the Advancement of Learning / McGill University, Montreal (CA)

( * ) Notice: Subject to any disclaimer, the term of this patent is extended or adjusted under 35 U.S.C. 154(b) by 261 days.

(21) Appl. No.: 13/216,373

(22) Filed: Aug. 24, 2011

(65) Prior Publication Data

US 2012/0054576 A1 Mar. 1, 2012

Related U.S. Application Data

(60) Provisional application No. 61/392,544, filed on Oct. 13, 2010, provisional application No. 61/385,602, filed on Sep. 23, 2010, provisional application No. 61/377,144, filed on Aug. 26, 2010, provisional application No. 61/376,801, filed on Aug. 25, 2010.

(51) Int. Cl.
*G06F 11/10* (2006.01)
*H03M 13/00* (2006.01)

(52) U.S. Cl.
USPC .......................................................... 714/807

(58) Field of Classification Search
USPC .................................. 714/760, 791, 800–801
See application file for complete search history.

(56) References Cited

U.S. PATENT DOCUMENTS 7,133,853 B2 * 11/2006 Richardson et al. ............ 706/15
8,196,025 B2 * 6/2012 Lakkis .......................... 714/800

* cited by examiner

*Primary Examiner* — Shelly A Chase
(74) *Attorney, Agent, or Firm* — The Law Office of Michael E. Kondoudis

(57) ABSTRACT

Low-Density Parity-Check (LDPC) codes offer error correction at rates approaching the link channel capacity and reliable and efficient information transfer over bandwidth or return-channel constrained links with data-corrupting noise present. They also offer performance approaching channel capacity exponentially fast in terms of the code length, linear processing complexity, and parallelism that scales with code length. They also offer challenges relating to decoding complexity and error floors limiting achievable bit-error rates. Accordingly encoders with reduced complexity, reduced power consumption and improved performance are disclosed with various improvements including simplifying communications linking multiple processing nodes by passing messages where pulse widths are modulated with the corresponding message magnitude, delaying a check operation in dependence upon variable node states, running the decoder multiple times with different random number generator seeds for a constant channel value set, and employing a second decoder with a randomizing component when the attempt with the first decoder fails.

16 Claims, 20 Drawing Sheets

METHOD AND SYSTEM FOR DECODING

CROSS-REFERENCE TO RELATED APPLICATION

This patent application claims the benefit of U.S. Provisional Patent Application 61/385,602 filed Sep. 23, 2010 entitled "A Method and System for Decoding"; U.S. Provisional Patent Application 61/376,801 filed Aug. 25, 2010 entitled "A Method and System for Error Correction Decoding"; U.S. Provisional Patent Application 61/377,144 filed Aug. 26, 2010 entitled "A Method and System for Improving Error Correction Performance for Low Density Parity Check Codes"; and U.S. Provisional Patent Application 61/392,544 filed Oct. 13, 2010 entitled "Method for Improving Error Correction Decoding Performance and Devices Thereof."

FIELD OF THE INVENTION

The invention relates to decoding of error correction codes and in particular to a method and system of decoding Low Density Parity Check (LDPC) codes.

BACKGROUND OF THE INVENTION

Low-Density Parity-Check (LDPC) codes are a type of linear error-correcting codes that are part of the family of linear block codes, which transform a message consisting of a sequence of information symbols of an alphabet into a fixed length sequence of encoding symbols. With linear block codes the input message length is less than the number of encoding symbols thereby providing redundancy allowing for detection and correction of errors. LDPC codes were originally invented by Gallager, see "Low Density Parity-Check Codes" (Monograph, M.I.T. Press, 1963), but little attention was devoted to them at the time, primarily because the required decoding complexity was too high for the processing resources that were available. In 1993, the introduction of turbo codes by Berrou, Glavieux and Thitimajshima, see "Near Shannon Limit Error-correcting Coding and Decoding: Turbo-codes" (Proc. IEEE Intl. Comm. Conf., pp 1064-1070, 1993), spurred interest for codes that could achieve error correction at rates approaching the channel capacity of the link they were applied upon. In the intervening 30 years semiconductor devices had gone from expensive Small Scale Integrated Circuits with tens to hundreds of transistors to consumer electronics such as Intel's fifth-generation microarchitecture, the P5 or Pentium, with 3 million transistors. LDPC codes were rediscovered by MacKay in the mid-1990s, see D. J. C. MacKay et al in "Near Shannon Limit Performance of Low Density Parity Check Codes" (Electronics Letters, vol. 32, pp. 1645-1646, August 1996).

LDPC codes are interesting mainly for two reasons. First, they offer an error correction performance that approaches the channel capacity exponentially fast in terms of the code length. Secondly, the decoding process has linear complexity and a high degree of parallelism that scales with the code length. LDPC codes are capacity approaching codes, meaning that practical constructions exist that allow transmitting information at a signal-to-noise ratio that is very close to the theoretical minimum, known as the Shannon limit. Using iterative belief propagation techniques, LDPC codes can be decoded in time linearly to their block length, a factor particularly beneficial as data rates in communication systems continue to increase.

LDPC codes, therefore, are finding increasing use in applications where reliable and highly efficient information transfer is desired. Although implementation of LDPC codes has lagged that of other codes, notably turbo codes, they are increasingly becoming the standard for error-correction in many applications including, but not limited to:

Digital Video Broadcasting-Satellite-Second Generation (DVB-S2) standard;

Forward Error Correction (FEC) within the ITU-T G.hn home network standard providing data rates up to 1 Gb/s over power lines, phone lines and coaxial cables;

IEEE 802.16e WiMAX;

IEEE 802.16n WiFi; and

IEEE 802.3an (10GBase-T Ethernet on CAT6 cables, which operates at 10 Gb/s).

Of significant importance for such applications, which address high-speed applications in essentially consumer markets, is the ability to implement economically and technically viable decoder circuits, since typically the implementation of the encoder is much less complex. By viable we mean one where the circuits have small die area, and hence low manufacturing cost, efficient power performance, and good processing performance in terms of throughput and latency, yet preserves the error-correction capability of the code.

The design of practical decoding algorithms does not focus so much on the coding gain offered by one code compared to another, but rather on the performance of a given algorithm on a given code. The aim is to optimize error-correction performance versus cost on the widest possible range of codes. Accordingly, throughout the following specification where cost is assessed it is done so at the algorithm level and hence in general terms.

At present amongst the challenges related to the decoding of LDPC codes are the decoding complexity of binary error-correction codes themselves and error floors. Decoding complexity for example means that today the codes chosen for IEEE 802.16e WiMAX and IEEE 802.3an Ethernet standards perform roughly 3 dB away from capacity, in part due to the cost of decoding circuits. Accordingly, reducing decoder cost using improved algorithms therefore permits increased efficiency of channel use in such applications. The phenomenon of error floors refers to the fact that LDPC codes can loose error-correction efficiency when the target error rate is very low. This problem is sometimes studied at the level of the code design, but given that the behavior is influenced by the choice of decoding algorithm and by implementation constraints, it is also possible to address this issue at the algorithm level.

Min-Sum Decoder:

Amongst the best known decoding algorithms for decoding LDPC codes is the Min-Sum algorithm (MS). Whilst the MS algorithm has decoding performance that is inferior to the Sum-Product algorithm (SP), the offset MS algorithm, which is a version of the MS algorithm, works very close to the performance achieved using SP algorithm. It has been shown in the prior art that a relaxed version of the MS algorithm has the potential to surpass the decoding performance of SP decoders, see S. Hemati et al in ""Dynamics and Performance Analysis of Analog Iterative Decoding for Low-Density Parity-Check (LDPC) Codes," (IEEE Trans. Comm. Vol. 54, pp. 61-70). It would therefore be beneficial to implement variants of the MS algorithm with low complexity and low power. Accordingly, the inventors have established a simple low-power and low-cost digital MS decoder that can be implemented with very simple and small processing nodes. This MS decoder also manages the power consumption in the wiring interconnecting the processing nodes which is a common problem in iterative decoders. The novel MS decoder exploits the fact that in a log-likelihood ratio (LLR) domain, the operations of an MS decoder become very simple. Accordingly, the digital MS decoder according to embodiments of the invention has variable nodes where the only operation is addition and check nodes where we have to only find the minimum absolute value of the incoming messages and XOR their sign bits. In the novel MS decoder the channel outputs are used directly and there is no requirement for an estimation of the noise power in MS decoders according to embodiments of the invention.

Delayed Stochastic Decoder:

In stochastic decoding information is represented by a data stream (either binary or non-binary) which represents numbers by a weighted stream of bits with binary digits inserted at random intervals such that the weight of one's or zeros' represents the number value. In the stochastic bit stream, complex mathematical operations are simplified to bitwise operations which can be performed by small logic functions. Within the prior art it has been shown that the performance of the stochastic decoders can exceed that of the current state of the art SP decoders.

In conventional LDPC decoders the logical hardware required to perform the computation is very large, and so the system is typically reduced by implementing a small subset of the required hardware and re-using it to perform a subset of the computations. This is known as the partially parallel architecture and results in several subsets of the computation being performed in series by progressing from one set of data to the next, and storing the intermediate results until the entire computation is completed. Whilst reducing logical hardware complexity the approach requires an additional memory (storage) overhead, increases power consumption, and incurs a delay in processing. Further when the length of a block code increases, the fully parallel implementation of the decoders is not trivial task, even using current stochastic methods. It would therefore be beneficial to be able to implement Stochastic Decoding in an architecture with reduced memory, reduced latency, and reduced power consumption. Accordingly, the inventors have established a method of implementing digital stochastic decoders that are simple, operate at low power, and can be implemented with low cost though the use of small and efficient processing nodes using a technique the inventors call "Delayed Stochastic" decoding.

Re-Decoding:

Beyond the actual physical implementation of decoders such as MS decoders, SP decoders etc. it is important to also assess the error rate performance of error correction codes such as a LDPC code and the different decoder implementations. In doing so it is common to discuss the error floor, an error floor being the region where there is diminishing return in the error-rate versus signal to noise ratio (SNR) as the SNR increases. Error rate being an important aspect of digital communications as high error rates require storage of the data at transmitting nodes, re-transmission, delays, increased network overhead etc. in respect of providing the content to the user associated with the digital data. This error floor is determined by a combination of the structure of the specific code employed as well as the decoding algorithm used to decode the encoded data. Error floors further constitute a significant limitation for communication systems when the desired error rate is below the error floor of the encoding/decoding system.

Error floors typically arise from the existence of weak sub-graph topologies within the code graph that are caused by the specific configuration of cycles in the graph. The term trapping sets is widely used to describe these sub-graphs. A received bit is said to be eventually correct if there exists an I such that the bit is correct for all subsequent iterations, namely i>I. A trapping set is defined as a set of received bits that are not eventually correct and that, together with their neighboring check nodes, form a connected sub-graph. The fact that the bits are not eventually correct implies that the decoder is not making progress, either because it has reached a stable point end point, or because it is oscillating, in which case the combination of oscillating states can also be defined as a stable point.

Valid codewords are also stable end points, and for this reason invalid stable points are commonly referred to as pseudo-codewords. The sub-graph of a trapping set is composed of the variable nodes that are not eventually correct, plus all the neighboring check nodes. Since the check nodes compute a parity-check equation, those having an even degree with respect to the sub-graph will be satisfied, and those having an odd degree will be unsatisfied. An (a,b) trapping set is defined as having a variable nodes and b odd degree check nodes with respect to the sub-graph. The set of variable nodes involved in the trapping set is denoted D, O(D), and E(D) are the sets of check nodes adjacent to D that have respectively odd and even degrees with respect to D. The neighborhood set N(D) is the set of all variable nodes adjacent to check nodes in O(D), with the implication that D is a proper subset of N(D).

The probability of a decoding error is lower bounded by the probability that some erroneous received bits form a trapping set of the code. If we assume a memory-less channel, this probability is a function of the a-priori bit error rate, which decays much slower than the coded error rate for typical signal-to-noise ratios that are of interest in typical communication systems. However, with additive white Gaussian noise (AWGN) on the channel there is no simple relationship between the received values and convergence of the decoder to a pseudo-codeword which produces a decoding failure. As a result, trapping sets can be viewed as structures that reinforce existing errors on a group of bits. If the errors in the set are not too strong while the values in N(D)\D are very reliable, it is possible that some bits in the set are corrected before the incorrect messages become too strong and accordingly convergence to the pseudo-codeword is avoided. Furthermore, the decoding trajectory can be affected by errors outside the trapping set, for example by making a check node in E(D) unsatisfied.

The trajectory of a decoder is defined as the sequence of states that it traverses until it terminates. The state space can be generalized for all algorithms as the space of all n(d+1) variable node inputs. Depending upon the decoder and the random choices made by a given decoder, several possible trajectories exist that go from a given initial state to a final stable state, whether this final state forms a codeword or a pseudo-codeword. Convergence to a pseudo-codeword depends on two competing characteristics of trapping sets: the amplification of the set-intrinsic information caused by positive feedback loops and the extrinsic information flow into the set. As iterative decoding progresses these trapping set errors become harder to correct.

Several deterministic approaches have been proposed in the prior art to resolve decoding failures caused by trapping sets. These solutions have a common basis in that they perform the decoding in two phases. The first phase uses a standard belief propagation decoder and if the decoding is successful after the first phase, the algorithm terminates. Otherwise, the decoder enters the second post-processing phase that has been designed to handle the trapping sets for that particular algorithm or algorithms. Optionally, the syndrome weight, the number of unsatisfied check nodes can be used to determine whether the failure was caused by a trapping set, and to decide whether to activate the second phase. This is based on the heuristic notion that if a received frame is too noisy to be decoded successfully, it is unlikely that the decoder will make much progress leading to a large number of unsatisfied check nodes, while if a frame was received with a manageable error, only a convergence to a pseudo-codeword could cause some parity-checks to remain unsatisfied after many iterations. Therefore, a relatively small number of unsatisfied checks remaining after the first phase are indicative of convergence to a pseudo-codeword.

Accordingly, considering trapping sets in LDPC codes for example, there exists a method to detect convergence to a non-global minimum, and it is understood how a local minimum state (pseudo-codeword) relates to the global minimum (codewords). Consequently several deterministic decoders have been devised to move the decoder out of a pseudo-codeword state in the second post-processing phase or as an extension of the first phase. However, all these decoders in order to operate with first and second phases require some knowledge of the trapping set structure. Accordingly, it would be beneficial to have a method to trigger moving a decoder between such phases that does not require knowledge of the trapping set structure. The inventors have established a method, termed re-decoding, that achieves this and hence does not depend upon such prior knowledge of the trapping sets, and in that sense the method may be applied fore generally to decoders.

Multi-Phase Decoding:

As noted supra iterative algorithms are employed in decoding, such as the aforementioned Min-Sum (MS) algorithm. Collectively the MS algorithm and similar iterative message passing algorithms that are also often used, such as the Sum-Product algorithm, are referred to as belief propagation (BP) algorithms. Convergence of BP algorithms to pseudo-codewords is related to the local processing of information at each node of the Tanner graph, and hence pseudo-codewords exist for all BP algorithms. Tanner graphs being bipartite graphs used to state constraints or equations which specify error correcting codes, where such codes are often used to construct longer codes from smaller ones and hence are employed in both encoders and decoders extensively.

This convergence to pseudo-codeword points as discussed above may be viewed as being responsible for error floors, and hence a lower bound on the achievable error rate of the BP decoding algorithm which is problematic for many applications. It is highly desirable in many applications to address this sub-optimality of BP decoders in the error floor region. Several algorithms have been proposed to reduce the number of decoding failures of BP algorithms and hence lower the error floor. To the best of the inventor's knowledge, these prior art solutions are based upon identifying the set of check nodes that remain unsatisfied in the case of a decoding failure. It would be beneficial therefore to have a methodology, and devices derived from said methodology, that reduces the number of decoding failures and produces a lower error floor without requiring identification of the check nodes explicitly and hence applicable to general BP decoders.

Accordingly, the inventors have established a methodology to achieve these goals with a reduced hardware complexity by providing multi-phase decoding. Received vectors that fail to be decoded by the standard decoding algorithm, the first phase, are forwarded to a second (and potentially further phases) wherein they are attempted again with the present invention. This second phase is independent from the first phase, unlike the prior art techniques, and exploits a random component for the decoding attempt(s) in the second phase. Further, as the second phase is independent of the first phase it can optionally be replicated to provide multiple independent decoding attempts or trials for received vectors that fail the first attempt thereby improving the overall success rate of the multi-phase decoder at decoding received vectors . . . .

Accordingly, the embodiments of the inventions described within the specification address the issues of decoding complexity in high-speed communication systems, thereby allowing reduced cost for implemented decoder circuits, and error floor reduction, thereby allowing improved link performance.

SUMMARY OF THE INVENTION

It is an object of the present invention to address limitations in the prior art relating to the decoding of error correction codes.

In accordance with an embodiment of the invention there is provided a method for message passing decoding wherein the messages passed between the processing nodes are represented using an approach where the width of a pulse is modulated with the magnitude of the corresponding message.

In accordance with another embodiment of the invention there is provided a device for message passing decoding wherein a unit forming a predetermined portion of the system modulates the width of a pulse with the magnitude of the corresponding data.

In accordance with another embodiment of the invention there is provided a method for decoding where the state of the processing nodes and current belief are passed and used to estimate probabilities within the decoding process.

In accordance with another embodiment of the invention there is provided a method for decoding comprising a plurality of check nodes and a plurality of variable nodes wherein a parity check operation relating to a predetermined sub-set of the check nodes is delayed based on the states of a predetermined sub-set of the variable nodes.

In accordance with another embodiment of the invention there is provided a method for decoding comprising a plurality of check nodes and a plurality of variable nodes wherein a parity check operation is determined in dependence upon a level of agreement between a predetermined sub-set of the variable nodes.

In accordance with another embodiment of the invention there is provided a method relating to error correction decoders that improves the performance of the error correction decoder specifically within the error floor region without a significant increase in complexity.

In accordance with another embodiment of the invention there is provided a method for decoding wherein an error correction decoder run multiple times with a different seed for a random number generator within the error correction decoder for the same set of channel values.

In accordance with another embodiment of the invention there is provided a method for decoding comprising receiving a transmitted codeword, attempting to decode the codeword with a first decoder and passing the resulting codeword to a second decoder which contains a component to randomize the decoding trajectory and decoding the codeword with the second decoder when the attempt with the first decoder fails.

In accordance with another embodiment of the invention there is provided a system for decoding comprising a codeword receiver, a first decoder and a second decoder, the second decoder comprising a component to randomize the decoding trajectory of the second decoder.

In accordance with another embodiment of the invention there is provided a decoder for decoding comprising a counter forming a predetermined portion of the counter wherein a first clock relating to operation of the counter differs from a second clock relating to operation of the remainder of the decoder.

In accordance with another embodiment of the invention there is provided a decoder for decoding comprising a variable node and a checks node connected by an edge, each the variable node is driven by a clock signal that may be set to one of two values, the one of the two values being determined in dependence of a transition relating to the edge.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
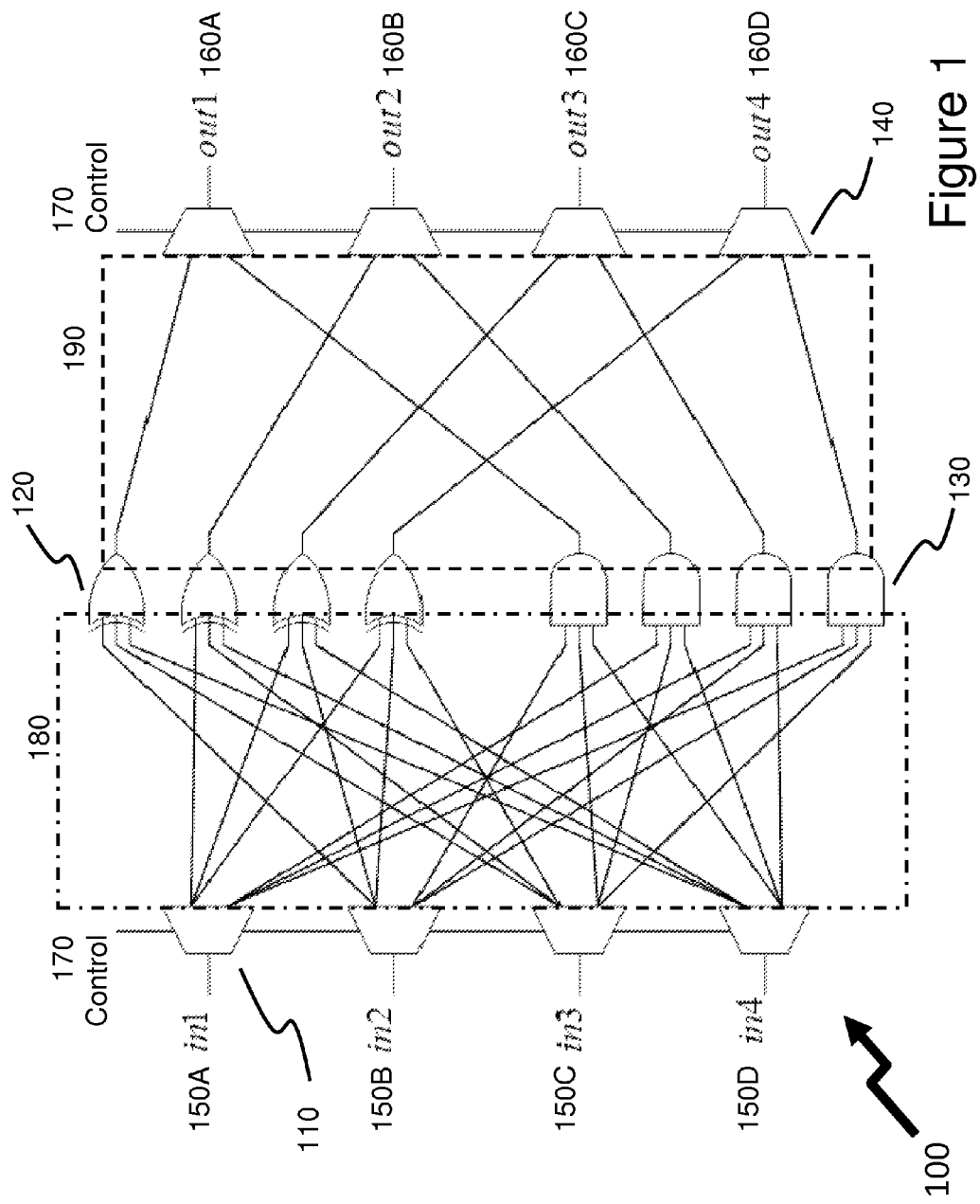
FIG. 1 depicts an architecture according to an embodiment of the invention for a degree-4 variable node wherein one control wire is employed for passing sign and data bits.

The present inventions are directed to decoders for decoding error correction codes and in particular to methods and systems of decoding that mitigate disadvantages of the prior art. Within the description of the different techniques presented below reference is made primarily to LDPC codes. However, other code formats, including but not limited to Polar Codes may also benefit from these techniques and accordingly the inventive steps and embodiments of the invention should be accorded the widest possible scope.

Within the following description reference may be made below to specific elements, numbered in accordance with the attached figures. The discussion below should be taken to be exemplary in nature, and not as limiting the scope of the present invention. The scope of the present invention is defined in the claims, and should not be considered as limited by the implementation details described below, which as one skilled in the art will appreciate, can be modified by replacing elements with equivalent functional elements or combination of elements. Within these embodiments reference will be made to terms which are intended to simplify the descriptions and relate them to the prior art, however, the embodiments of the invention should not be read as only being associated with prior art embodiments.

Min-Sum Decoder:

As discussed in the overview embodiments of the invention teach to simple low-power and low-cost digital Min-Sum (MS) decoders that can be implemented with very simple and small processing nodes and provide for the management of the power consumption in the wiring that is a common problem in all iterative decoders.

In the log-likelihood ratio (LLR) domain, operations in an MS decoder become very simple In the variable nodes the only operation is addition and in check nodes, we have to find minimum absolute value of the incoming messages and XOR their sign bits. Beneficially the channel outputs of a decoder are used directly and there is no need for estimation of noise power in MS decoders.

One of the novel aspects of the invention is that decoders implemented according to embodiments of the invention use a message passing methodology wherein the width of pulses are modulated with the magnitude of the corresponding message being passed. In fact, the duty cycle of the pulses changes based on their magnitude. For example, we can utilize a sequence of "1"'s that comes after a sign bit. With this scheme during an iteration all wires are charged only once. This therefore reduces the switching activity in the interconnections and accordingly reduces power consumption of the decoder circuit. It can be shown that by using this message representation method, we can also simplify parity-check nodes in a MS iterative decoder.

Considering M1=7, M2=15, and M3=3 then these messages can be represented as a sequence of "1"'s followed by a sequence of "0"s as shown in Table 1 below. Accordingly, in order to determine the minimum message among M1, M2, and M3, it is only necessary to apply these to a simple three input AND gate as also shown in Table 1.

TABLE 1

An example of representing magnitude of messages by a sequence of '1's and finding minimum among these messages

| M1 | 1 | 1 | 1 | 1 | 1 | 1 | 1 | 0 | 0 | 0 | 0 | 0 | 0 | 0 | 0 | 0 |
|---|---|---|---|---|---|---|---|---|---|---|---|---|---|---|---|---|
| M2 | 1 | 1 | 1 | 1 | 1 | 1 | 1 | 1 | 1 | 1 | 1 | 1 | 1 | 1 | 1 | 0 |
| M3 | 1 | 1 | 1 | 0 | 0 | 0 | 0 | 0 | 0 | 0 | 0 | 0 | 0 | 0 | 0 | 0 |
| Min(M1, M2, M3) | 1 | 1 | 1 | 0 | 0 | 0 | 0 | 0 | 0 | 0 | 0 | 0 | 0 | 0 | 0 | 0 |

This implies that for implementing a check-node of degree four, in addition to four 3-input XOR gates that are normally used for finding the output sign bits, we need four 3-input AND gates (or equivalently seven 2-input AND gates) for finding the minimum magnitudes. It is worth noting that if we interpret messages correctly in the variable nodes, we can use NAND gates instead of AND gates to further simplify the check nodes.

Such a check-node of degree four being shown in FIG. 1 wherein there are four inputs coupled to four input parity check nodes 150A through 150D respectively wherein the signals are passed to four 3-input XOR gates 120 and four 3-input AND gates 130. The inputs to the four 3-input XOR gates 120 and four 3-input AND gates 130 being connected to the four input parity check nodes 150A through 150D through first interconnection mapping 180. The outputs of the four 3-input XOR gates 120 and four 3-input AND gates 130 are then coupled to the four output parity check nodes 160A through 160D via second interconnection mapping 190.

According to a further embodiment of the invention a single wire is used for passing sign and data bits within a check node is provided. Hence referring to FIG. 1 a control wire, Control 170, that is connected to all input parity check nodes 150A through 150D and output parity check nodes 160A and 160D. This is used for selecting suitable operations for processing sign bits and data bits in the parity check nodes. This selection is performed by disabling and enabling XOR and AND modules. According to embodiments of the invention the Data and Control 170 wires charge and discharge once in each iteration.

It is possible to further simplify the check nodes by noting that after the sign bits; there is a sequence of ones that we want to find the shortest sequence of, such as shown above in respect of Table 1. As such it is possible to eliminate the AND gates 130 in FIG. 1 and only use the XOR gates 120 thereby resulting in the simplified degree-4 check node 200 depicted in FIG. 2. Accordingly the first interconnection mapping 180 is simplified to mapping 250 and second interconnection mapping 190 is eliminated. From this it can be observed in that as soon as one of the inputs of an XOR gate 120 becomes zero (that would be the shortest sequence), the output of the XOR 120 flips. If the degree of a check node is an even (odd) number, then the XOR 120 flips from one to zero (zero to one).

Figure 2:
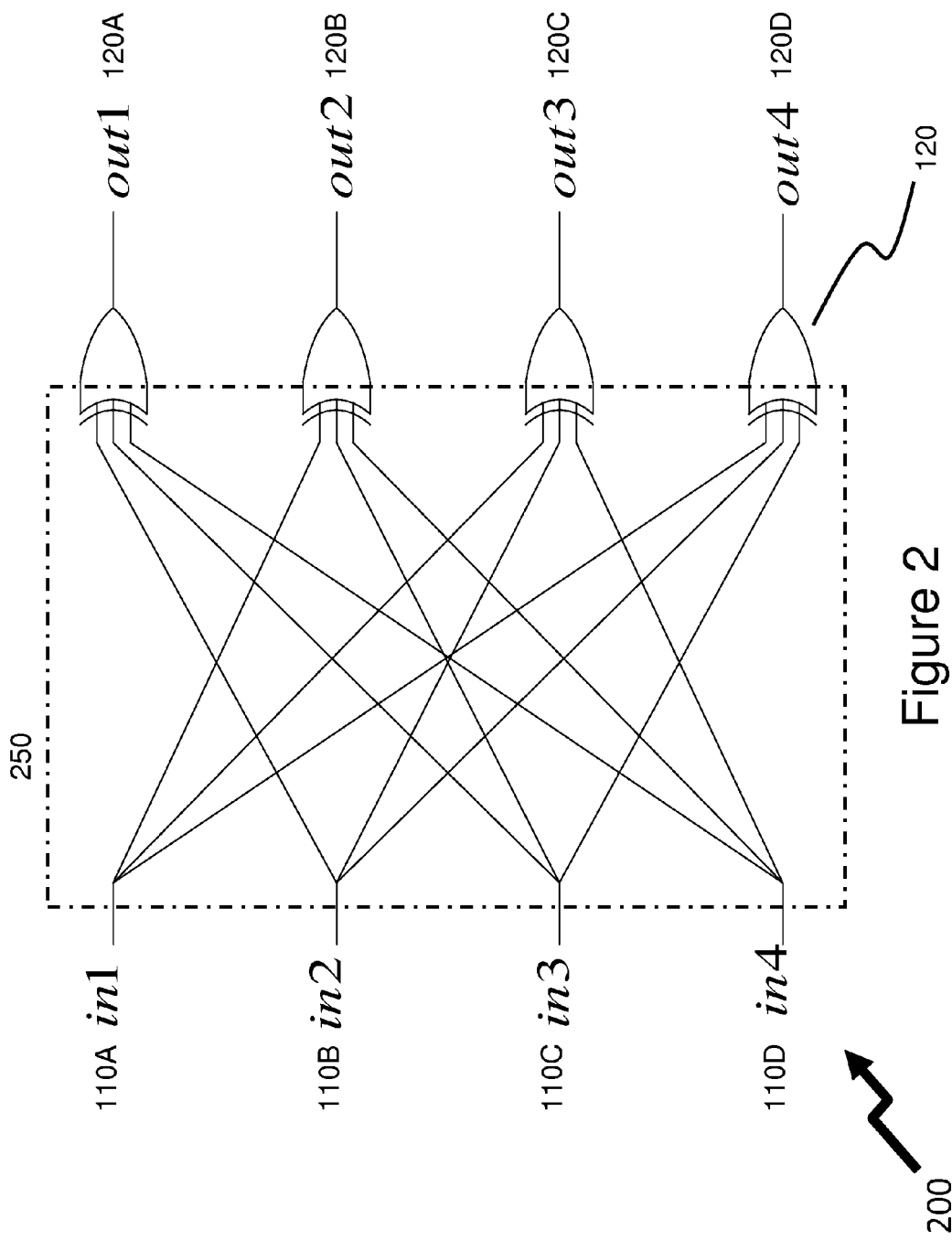
FIG. 2 depicts a simplified check node according to an embodiment of the invention that can be employed for check nodes in both hard decision decoders and stochastic decoders.

Therefore, as long as we interpret the incoming messages correctly at the variable nodes, it is possible to use the simplified version of the check node, namely simplified degree-4 check node 200 in a decoder. However, this simplified version, does not give the correct answer if two or more inputs of a check node have equal magnitude and become minimum at the same time. Accordingly, simplified degree-4 check node 200 in FIG. 2 shows the simplified check node that is exactly same as check nodes implemented in both hard decision decoders and stochastic decoders. For floating point MS decoder check nodes the incoming messages will rarely become equal and become minimum inputs at the same time. For a quantized MS decoder this scenario will be more likely to happen.

TABLE 2

An example of how the XOR function can be used for ending the minimum input using M1, M2 and M3 as previously employed in Table 1.

| M1 | 1 | 1 | 1 | 1 | 1 | 1 | 1 | 0 | 0 | 0 | 0 | 0 | 0 | 0 | 0 | 0 |
|---|---|---|---|---|---|---|---|---|---|---|---|---|---|---|---|---|
| M2 | 1 | 1 | 1 | 1 | 1 | 1 | 1 | 1 | 1 | 1 | 1 | 1 | 1 | 1 | 1 | 0 |
| M3 | 1 | 1 | 1 | 0 | 0 | 0 | 0 | 0 | 0 | 0 | 0 | 0 | 0 | 0 | 0 | 0 |
| M1@M2@M3 | 1 | 1 | 1 | 0 | X | X | X | X | X | X | X | X | X | X | X | X |

Figure 3:
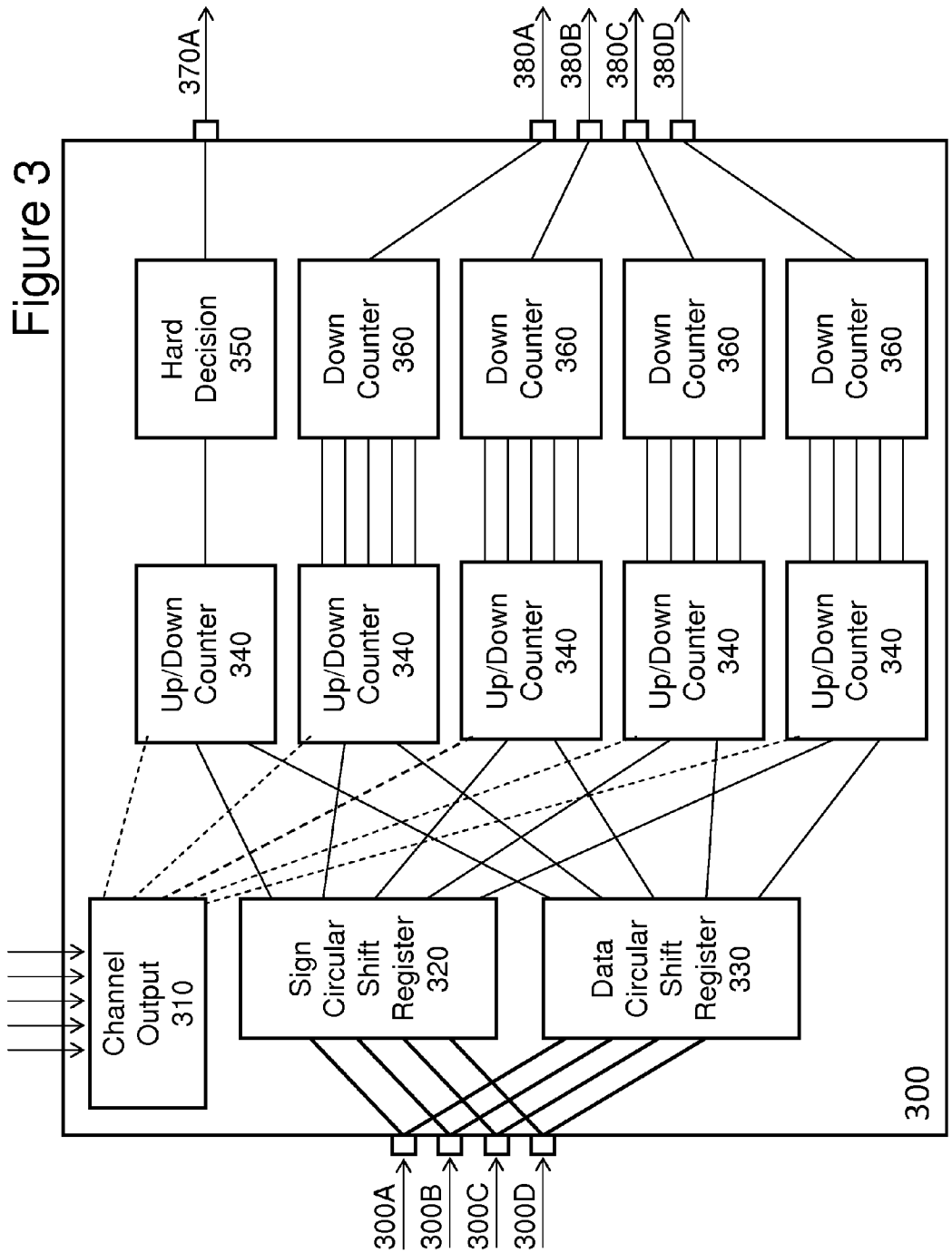
FIG. 3 depicts the basic structure of a degree four variable node according to an embodiment of the invention.

Now referring to FIG. 3 there is shown the basic structure of a degree four variable node 300 according to an embodiment of the invention. In a variable node, each incoming edge is connected to a one-bit memory cell. The first received bit in each iteration for each edge, is a sign bit that is saved for one complete iteration as it indicates sign of the following bits. It is worth noting that each iteration takes at least $2^m+1$ clocks for a (m+1) bit message. Data bits that are received after a sign bit, will be stored temporarily and are used together with the sign bits to update counters in the variable node.

Accordingly, incoming data 300A through 300D is connected within degree four variable node 300 to Sign Circular Shift Register 320 and Data Circular Shift Register 330 wherein it is then coupled to an array of Up/Down Counters 340 which also receive channel output data through channel output interface 310. The output of one of the Up/Down Converters 340 is then directly coupled to a Hard Decision block 350 whilst the remainder of the Up/Down Converters 340 are then directly coupled to Down Counters 360 wherein the outputs of these provide the output data 380A through 380D.

Figure 4:
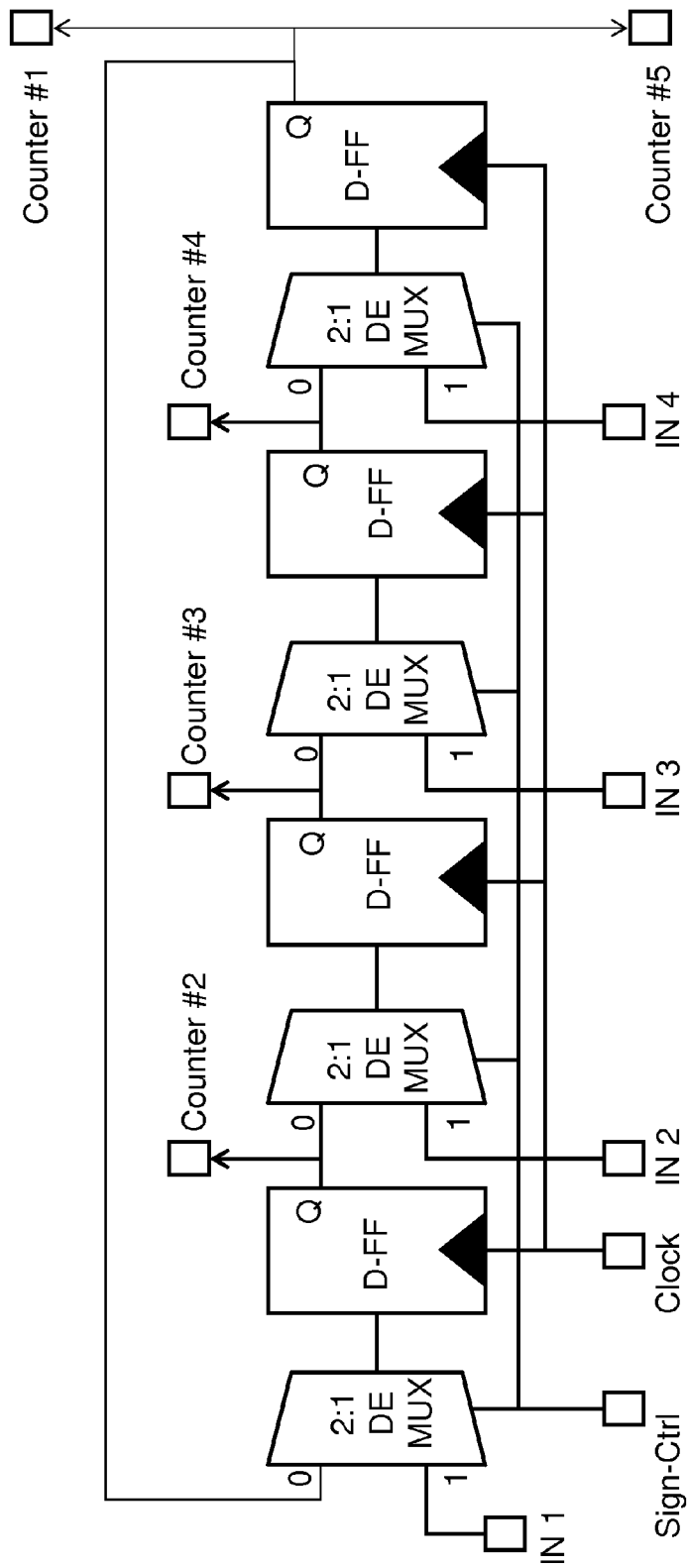
FIG. 4 depicts a 4-bit parallel-in parallel-out circular shift register for storing sign bits according to an embodiment of the invention.

Referring to FIG. 4 there is shown a 4-bit parallel-in parallel-out circular shift register 400 that is used for storing sign bits, such as Sign Circular Shift Register 320 in FIG. 3 above. Received sign bits are written in the register when Sign-Ctrl is active, which happens only at the beginning of an iteration. Accordingly, the sign bits are circulated in the register that has five output taps that are connected to five counters. Whilst four counters are used for outgoing messages (#1 to #4) and will be active for only three clocks to receive three bits, counter #5 remains active for four clocks and receives all four bits. In fact, the sign of this counter (counter #5) can be used for the estimating sign of the variable node.

Figure 5:
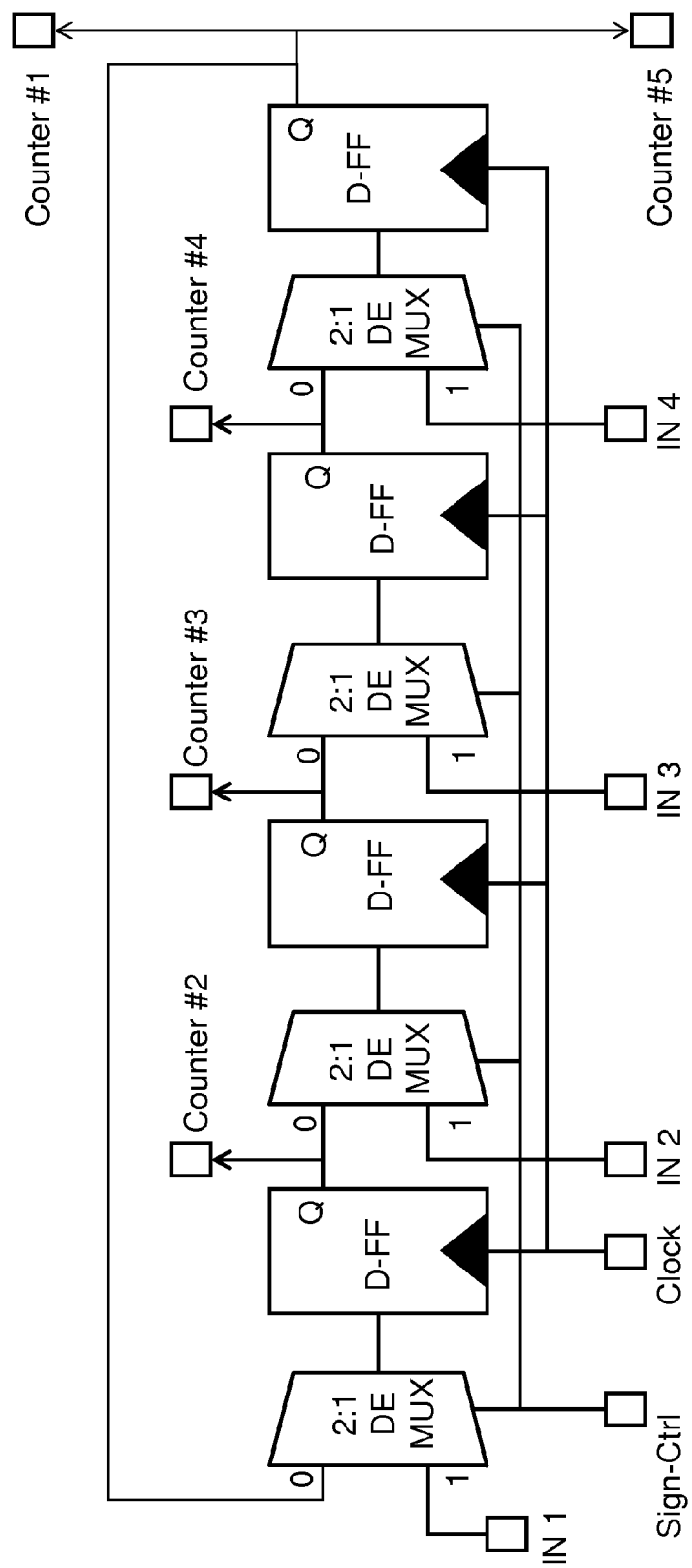
FIG. 5 depicts a 4-bit parallel-in parallel-out circular shift register for storing data bits according to an embodiment of the invention.

Now referring to FIG. 5 there is depicted a similar circuit to 4-bit parallel-in parallel-out circular shift register 400 which is used for storing data bits, namely 4-bit parallel-in parallel-out circular shift register 500, such as Data Circular Shift Register 330 in FIG. 3. Likewise, in 4-bit parallel-in parallel-out circular shift register 500 data bits are written in the shift register $2^m$ times during each iteration, where messages can be represented by at least (m+1) bits and the corresponding sequence of ones can be as long as $2^m+1$ bits (one bit is used for representing the sign bit).

Figure 6:
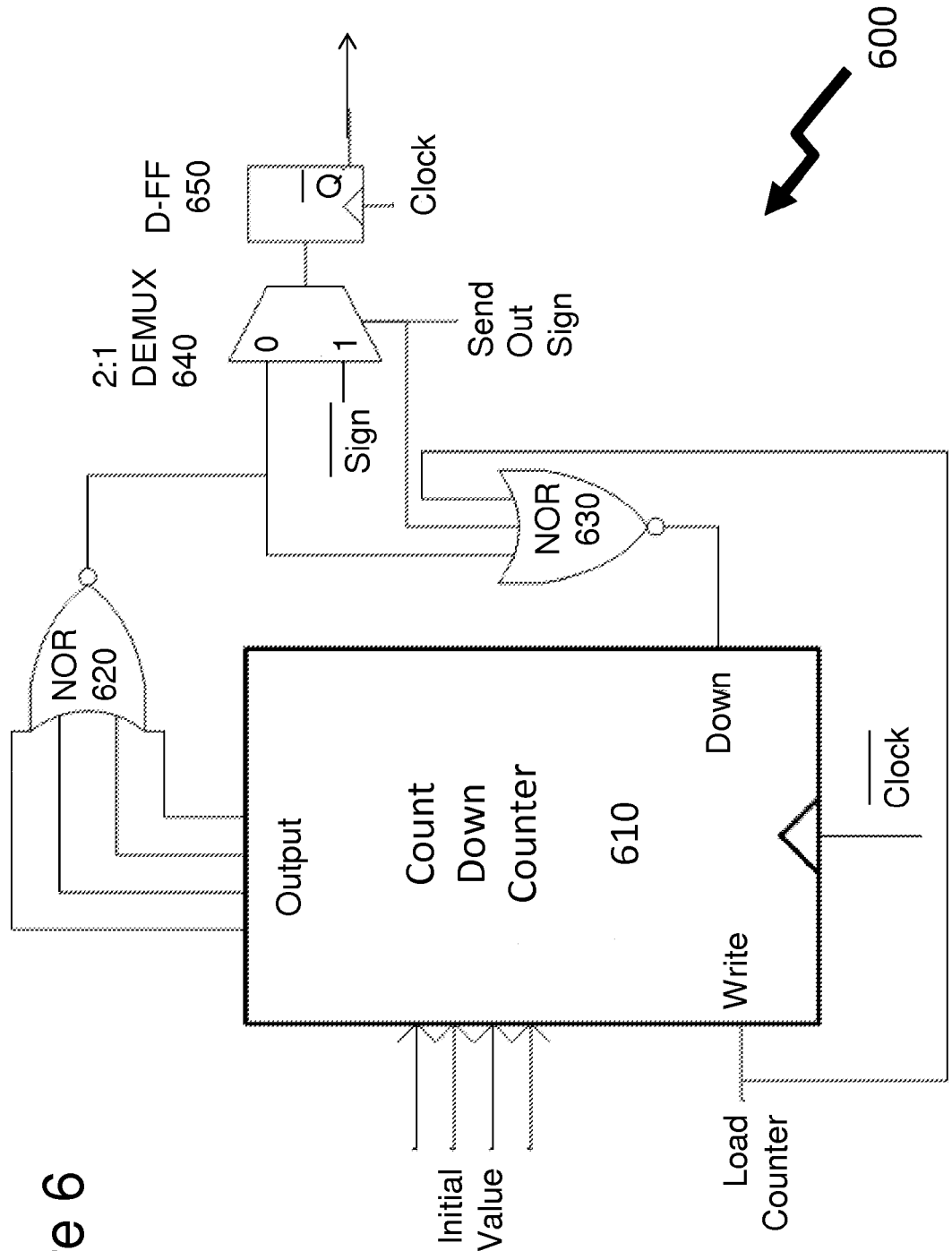
FIG. 6 depicts a count-down counter that is associated with each outgoing edge according to an embodiment of the invention.

Referring to FIG. 6 there is depicted a count down counter 600 that is associated with each outgoing edge, such as Down Counters 360 in FIG. 3. This counter receives a positive number and a sign bit. A LoadCounter signal initiates the counter and as soon as it goes low, the counter becomes ready for its operation. In the first iteration, the channel outputs are used as initial values for the count down counters and in the following iterations, the variable node's outgoing messages will be used as initial value for the counter. When the SendOutSign signal is high, the sign appears at the outgoing edge. The SendOutSign signal remains high long enough for receiving reliable signals from parity check nodes at the variable node input circuitry. This path will be the longest path in the decoder and enforces the maximum rate of communication between variable nodes and check nodes. When the SendOutSign signal becomes low, the counter starts to count down until it reaches zero (for an offset MS decoder, the counter would be stopped earlier) and therefore outgoing edges remain high until the counter reaches zero.

Figure 7:
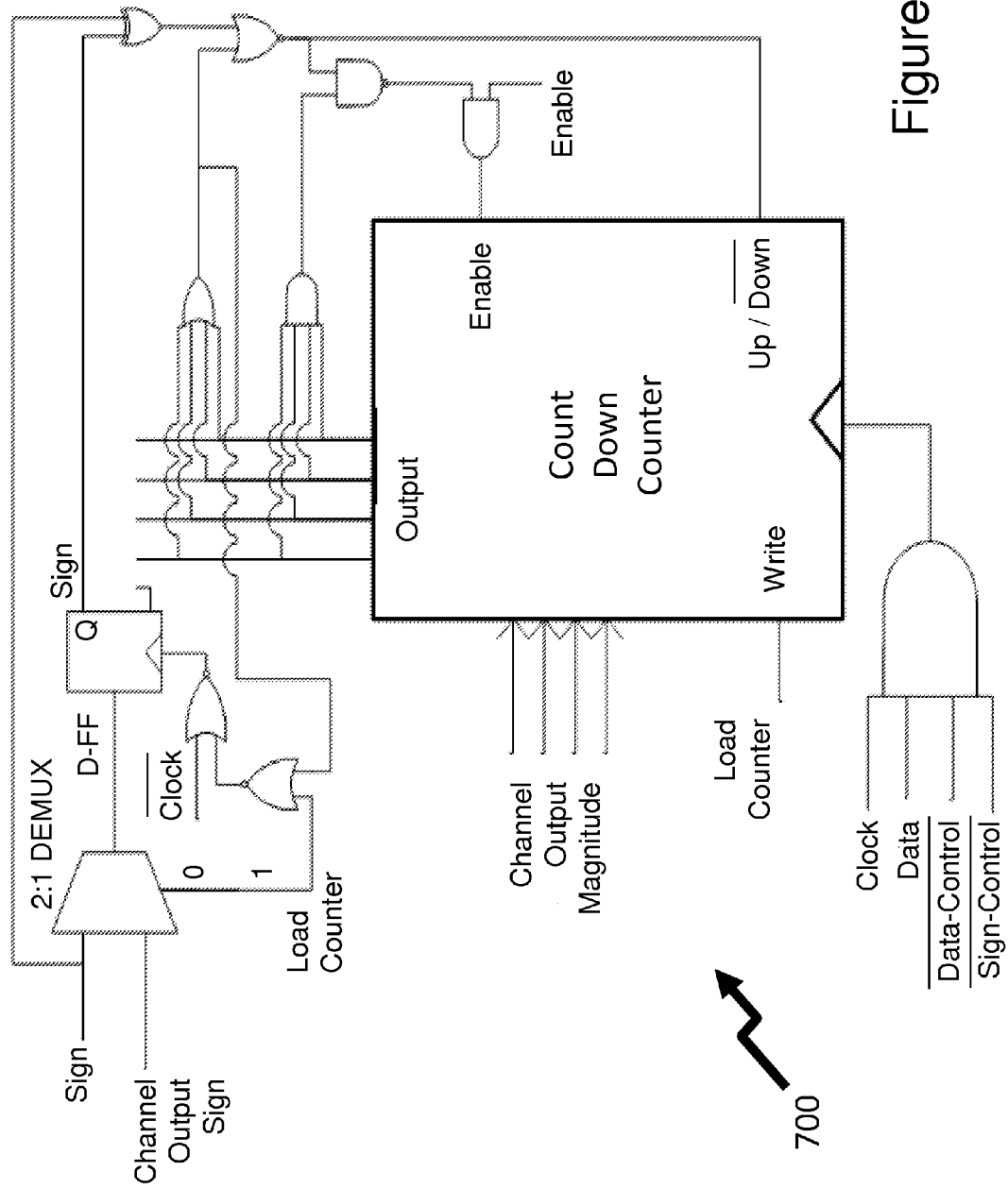
FIG. 7 depicts an up/down counter that is used for adding the extrinsic information received from check nodes to the channel outputs according to an embodiment of the invention.

Now referring to FIG. 7 there is depicted an up/down counter 700 that is used for adding the extrinsic information received from check nodes to the channel outputs. This module receives sign and data bits from the circuits in FIGS. 3 and 4 and counts up/down depending on the received bits and sends its outputs to the circuit in FIG. 6. The up/down counter 700 only take cares of the magnitude and a separate flip flop is used for representing the sign bit. In fact, when decoding starts the up/down counter 700 is preset by the related channel outputs and at the end of an iteration the counter's content is copied to a count down counter that generates a variable node's outgoing messages. Decoding starts by writing the magnitude of the received information in the counter and setting the sign flip-flop correctly. The counter is protected against overflow and will not reset after it reaches its maximum value. Also, when it becomes zero, the count up/down control lets it operate correctly and the sign bit will change accordingly.

The clock frequency inside the up/down counter 700 according to embodiments of the invention can be equal to or higher than the overall clock of the decoder. This is possible as the up/down converter 700 consists of simple operations and there are no large capacitances or long critical paths involved. Potentially the clock frequency within up/down counter 700 can actually be substantially higher than the clock frequency in the decoder. Accordingly, using a faster clock in the up/down counter 700 and for the communications between check nodes and variable node, we do not have to wait many clock cycles for processing to complete. Accordingly, unlike prior art MS decoders, the processing at the check nodes and variable nodes within the decoder occurs at the same time. This novel feature improves the overall throughput of an MS decoder according to embodiments of the invention and provides some compensation for the slow communications between check nodes and variable nodes that otherwise exists.

Furthermore, with embodiments of the invention, it is possible to further increase the speed of an MS decoder by noting that what really matters in an iteration is when a '1' to '0' transition happens for each edge. Between these events, the variable nodes' outgoing messages remain unchanged and thus variable nodes' incoming messages will not change either. As a result the decoder does not really need to remain idle between these events. As such it is possible to compress time between these events by running the clock at a higher rate than its nominal value, normal rate, between the events. In order to provide for this, all of the variable nodes within the decoder are connected to an event indicator line and when a "1" to "0" transition occurs for an outgoing edge the clock frequency returns to its normal value allowing the "reliable" information to appear at the variable nodes' inputs. After that event, the clock runs faster until the next event.

As an example, consider that the smallest magnitude among all variables' outgoing messages is equal to 7. This means that for 6 clocks we can ignore the critical path and run the clock as fast as possible for the counters and circular shift registers. Again after the $7^{th}$ clock, if there is no event at the $8^{th}$ clock, the frequency can be increased and continues until the end of iteration. This approach is particularly effective when the range of variations (variance) of the magnitudes of the messages is low. For example at high signal-to-noise ratio (SNR) values, when all messages are large, this approach can be exploited to further improve the efficiency of these decoders.

Delayed Stochastic Decoder:

As discussed supra in respect of FIGS. 2 through 7 there is significant benefit in establishing decoders that can be implemented with reduced complexity thereby allowing them to realize benefits in terms of reduced power, lower cost and improved performance. Accordingly in these FIGS. 8 through 10 structural improvements are presented for improving check-nodes (CN, also known as parity-check nodes) and variable nodes (VN) within a decoder. The structure of an error correcting code, such as LDPC codes as well as Min-Sum and Sum-Product algorithms can be described in terms of a factor graph, which is a bipartite graph that expresses the relationship between independent variables and local functions. In the context of LDPC codes, the independent variables are the likelihood associated with the codeword bits, which are involved in some parity-check equations (the local functions). Such graphs denote the variable nodes and check nodes together with their associated edges. An edge, depicted as a line in the graph, connects an $i^{th}$ variable node in the graph to a $j^{th}$ check node in the graph if the $i^{th}$ codeword bit is included in the $j^{th}$ parity-check equation.

Figure 8:
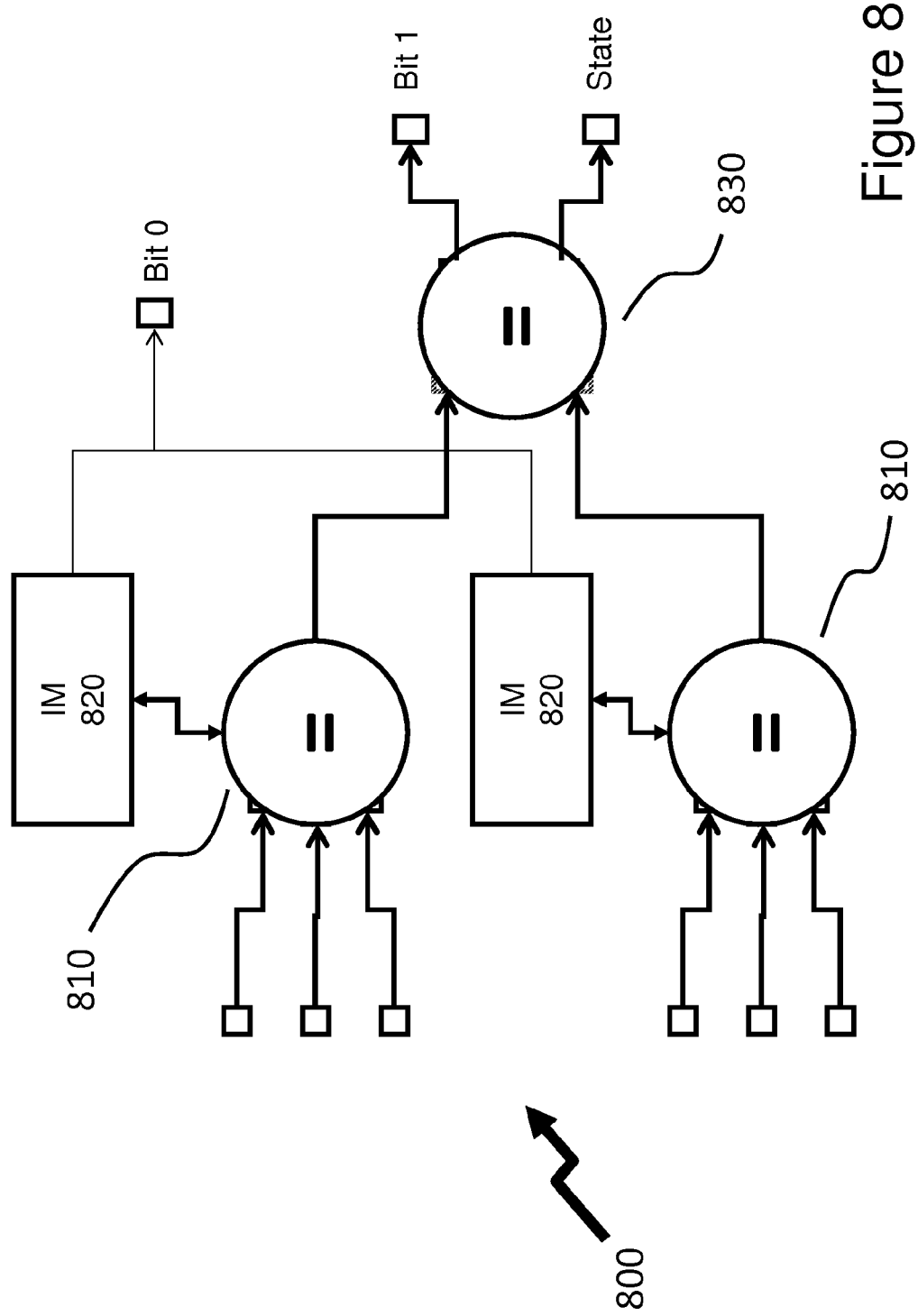
FIG. 8 depicts an approach to the construction of a degree-6 edge in a variable node according to an embodiment of the invention.
Figure 9:
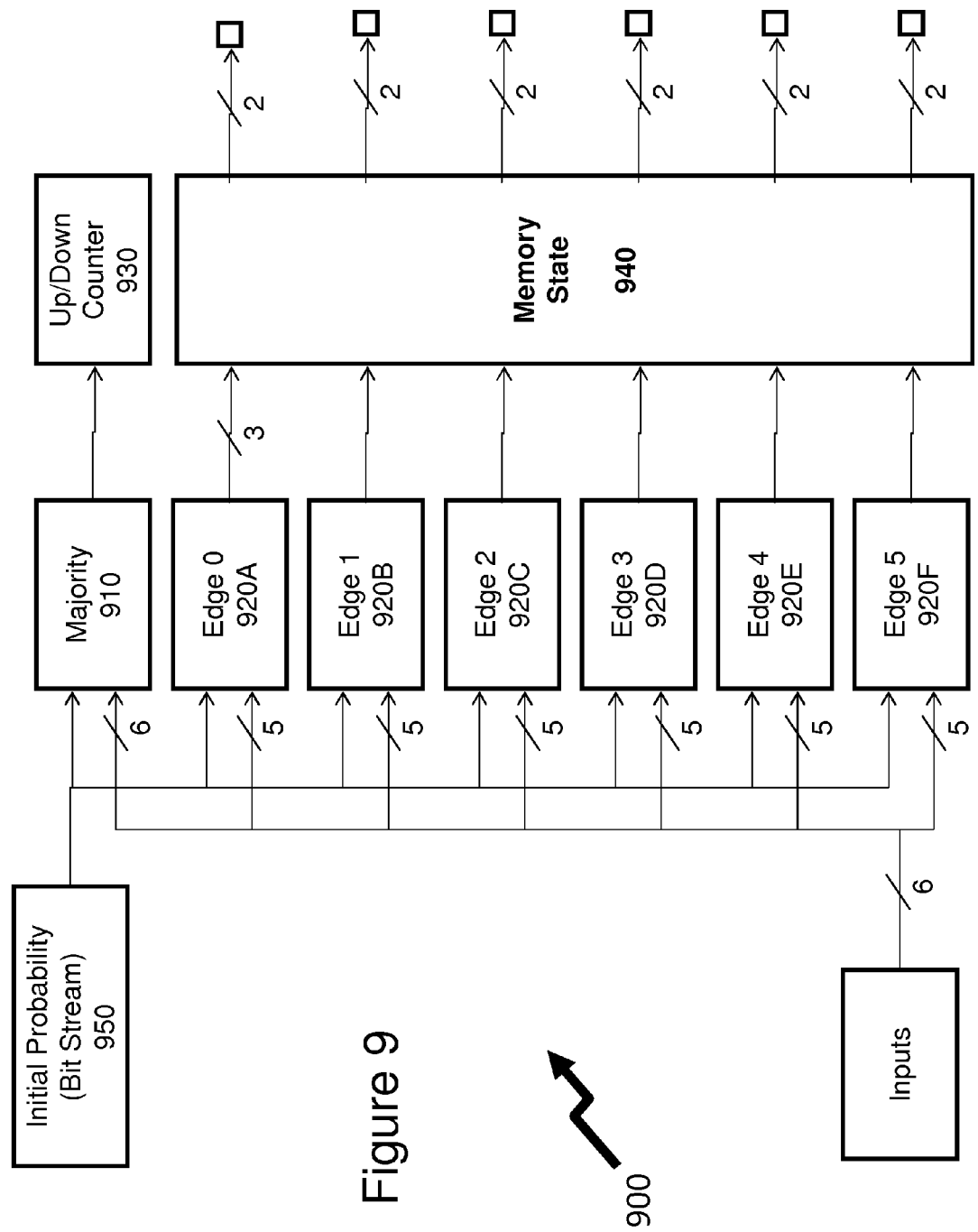
FIG. 9 depicts an approach to construction of a degree-6 variable node for a Delayed Stochastic Decoder according to an embodiment of the invention.

With a generalized degree-N variable node (VN), there are N edges, one majority up-down counter, one majority state generator, and one bit-stream-generator wherein the VN receives N inputs. Every edge in a variable node also receives N inputs, which are N−1 out of the N VN's inputs in addition to one bit from the bit-stream-generator. The bit-stream-generator generates a bit randomly with the given channel probability. An example of a degree-6 VN decoder according to an embodiment of the invention is shown in FIG. 9 comprising majority state generator 910, edges 0 through 5 920A through 920F respectively, majority up-down counter 930, and majority state generator 940. Each edge calculates whether its inputs are equal or not. A high-degree edge can be constructed from low-degree edges. For example, a degree-6 edge is built using two degree-3 and one degree-2 equality blocks as shown in FIG. 8 with degree-6 VN 800. Hence, the 6 inputs are divided into two sets and each set includes three inputs. Each degree-3 equality block 810 processes each set based on following rules:

1) If all inputs are equal, one of them is passed to the output and is also registered in the first bit of the internal memory (IM) 820, wherein the previous values of the IM 820 are shifted one bit down (like a shift register); and 2) If all inputs are not equal, one bit is read randomly from the IM 820 and passed to the output.

The degree-2 equality block 830 then receives two bits from the degree-3 equality blocks 820. If both are equal, then that edge is in an agreement state, otherwise the edge is in hold state (disagreement state). There are three outputs for each edge; Bit0, Bit1, and state. Bit 0 is read randomly from all IMs 810 of an edge. Bit 1 is the output of the first degree-3 equality block. The state signal shows the edge is in agreement or hold state.

Referring to FIG. 9 there is depicted a degree-6 VN 900 for a Delayed Stochastic Decoder according to an embodiment of the invention. The majority up-down counter 910 receives all N inputs to the degree-6 VN 900 in addition to one bit from bit-stream-generator 950 (N+1 inputs). The up-down counter 930 counts up if majority of its inputs are one, otherwise it counts down. Each of the edges 0 through 5 920A through 920F receive N−1 inputs to the degree-6 VN 900 as well as a bit from the bit-stream-generator 950. The outputs from the edges 0 through 5 920A through 920F are coupled to majority state generator 940 which then outputs majority state decisions.

In the algorithm according to embodiments of the invention, referred to as delayed stochastic (DS) decoding, the actual check operation in a check node is performed only when there are agreements on all of the variable nodes connected to that check node (check node edges), otherwise it is delayed. The actual check operation for edge number (I) is to XOR all inputs except the input number (I).

In order to postpone the check operation, variable nodes report their states (agreement or disagreement) as well as their beliefs. If at least one case of disagreement is reported to a check node, then that check node is set into the "delay" state. Hence, the check node returns the received belief without any change to the variable nodes reporting an agreement state.

Such a reply from the check node holds the current state (agreement) of the variable node, and allows the other variable nodes to get out of their disagreement state. Those variable nodes reporting disagreement states are answered by a random bit. It can be seen from Equation (1) below, that random bits with a probability of 0.5 are ignored in the next iteration.

$$P_C = \frac{P_A P_B}{P_A P_B + (1-P_A)(1-P_B)} \quad (1)$$

The latency of a Delayed Stochastic Decoder using a degree-6 VN 900 can be reduced in large part by the efficient use of the Internal Memories (IMs). These IMs are also used to build up high order edges in a variable node. Typically, IMs are limited to a few bits (usually two) for every three inputs in a degree-6 variable node for instance, so the hardware cost is low. In this example there are at least four bits of information on each edge that represent an estimation of probability, such an estimate being based on a degree-4 Moving Average Filter for example, and can be used whenever majority of edges are in disagreement states.

If the majority of edges in a variable node are in disagreement, they will not be sent to check nodes. Instead, one bit is randomly chosen from the IMs and reported as if it were an agreement state. Accordingly, degree-6 VN 900 for a Delayed Stochastic Decoder operates without the need for a probability estimator for disagreement states unlike prior art VNs according to an embodiment of the invention.

Figure 10:
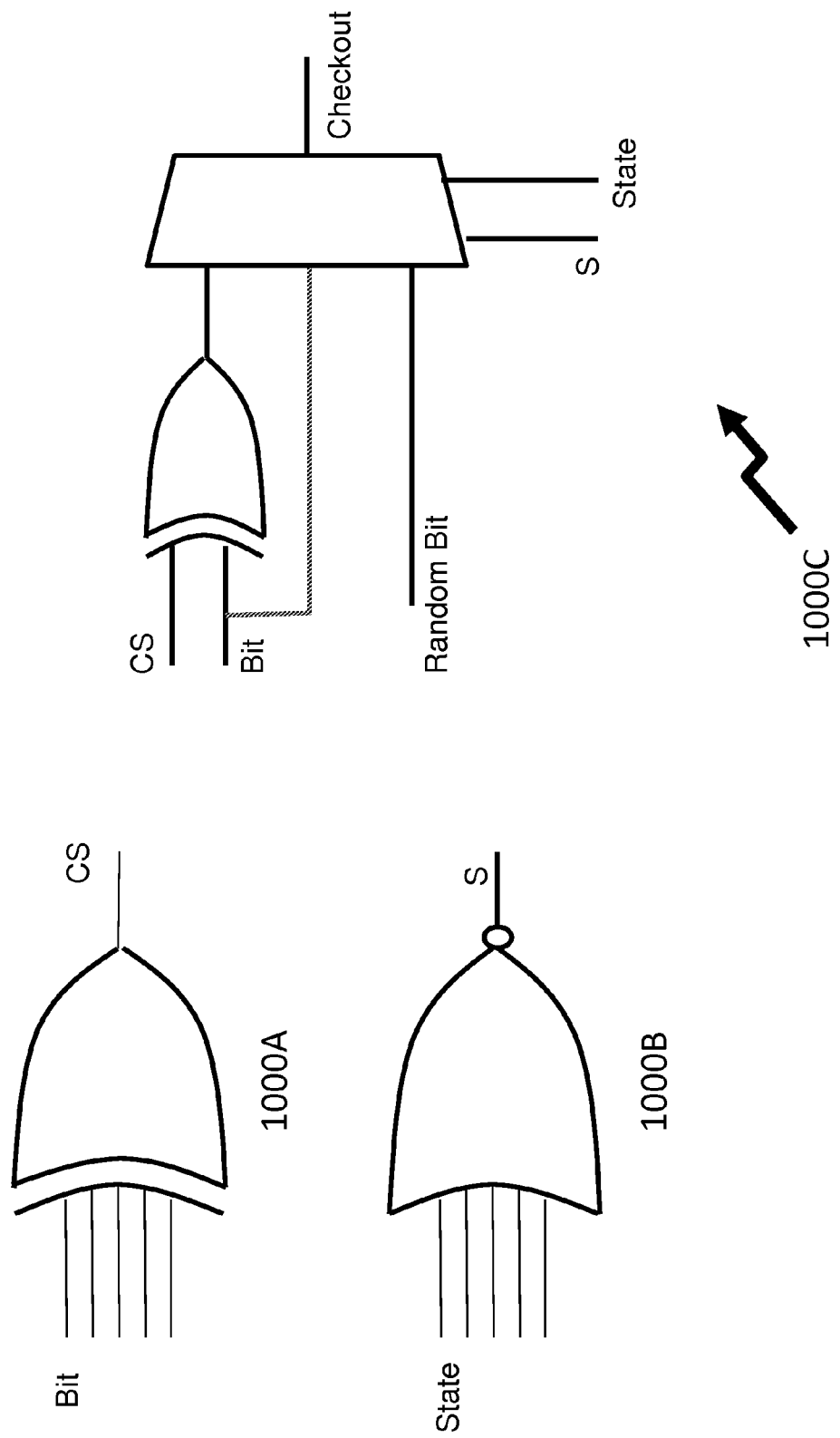
FIG. 10 depicts an approach to the construction of a check node according to an embodiment of the invention.

FIG. 10 depicts an implementation of a check node (CN) 1000C. Bit and State signals are generated using CS signal generator 1000A and S signal generator 1000B representing the variable node's belief and state respectively. CN 1000C shows the output signal of the check node in response to the input pair of (Bit, State) together with the CS and S signals from the CS signal generator 1000A and S signal generator 1000B respectively. This logic may be located in either the variable node or in the check node.

Accordingly there is depicted in respect of FIGS. 8 through 10 and architecture and process for a novel Delayed Stochastic Decoder with low complexity implementations for both variable nodes and check nodes. However, it is evident to one skilled in the art that optimizing decoders for power, speed, and cost across multiple applications and codes may require both innovations in both hardware and software/firmware. The former as noted supra in respect of FIGS. 1 through 10 may allow reduced circuit complexity in implementing the variable and check nodes as well as novel control approaches to reduce power consumption and complexity. Reductions in these aspects allow either decoders to be implemented with lower cost silicon processes or increase the functional integration into the decoder circuit, thereby reducing, for example, the FPGA count or allowing increased functional integration into an FPGA core for example.

Re-Decoding:

As discussed in the background reduced error performance also requires consideration of trapping sets within the decoding algorithm and knowledge of the convergence of the decoding process to a pseudo-codeword. This convergence essentially depends upon the result of a race between extrinsic information flow into the trapping set and the amplification of set-intrinsic information.

The problem of preventing an iterative belief propagation decoder from converging to a pseudo-codeword can be rephrased as being the problem of altering the trajectory of the decoder so that the set-extrinsic information determines the early progress of the decoder. One way to achieve this in the prior art is to try different random trajectories until convergence to a codeword is detected. This approach can, for example, be used with a Relaxed Half Stochastic (RHS) decoder as disclosed by the inventors in "A Relaxed Half-Stochastic Iterative Decoder for LDPC Codes" (Proc. IEEE Globecom 2009, Comm Theory Symposium, pp. 1-6) which uses randomized messages.

However, in most practical applications where the decoder is intended to work with a fixed or maximum latency budget, a more innovative approach is required. It is worth noting that the decoding of a channel code can be re-formulated as an optimization problem. Pseudo-codewords caused by trapping sets can then be viewed as local minima that must be avoided in the search for a global minimum, with the distinction that those local minima are actually caused by the decoder, and do not exist in the initial problem. Beneficially, when compared to a general optimization framework there exists a simple method of determining whether the decoder has converged to a codeword, by checking that the syndrome is zero.

For the case of trapping sets in LDPC codes, there exist in the prior art methods to detect convergence to a non-global minimum, and it is generally understood how a local minimum state (pseudo-codeword) relates to the global minimum (codewords). Consequently several deterministic decoders have been devised to move the decoder out of a pseudo-codeword state. However, all these decoders require some knowledge of the trapping set structure.

However, the inventors using a technique they term "re-decoding", have established a method that does not depend on such knowledge of the trapping set structure. As such, the embodiments of the invention provide a more generalized approach. Considering a RHS decoder, the amount of noise on the trajectory is controlled by the value of the relaxation factor B. A higher value of the relaxation factor causes the variable node input to vary more widely as new bits are received. Re-decoding relies on the B sequence of the RHS decoder to start with a very noisy trajectory, and then reduce the noise to let the decoder converge. The re-decoding phase being started after the decoder has failed once. By using a different B sequence specifically for re-decoding this sequence can be optimized or adjusted to break trapping sets.

As discussed above it is possible to detect that a decoder has converged to a pseudo-codeword by observing the number of unsatisfied parity-check equations. However, because re-decoding is a randomized approach potentially multiple trials may be necessary for the decoder to successfully converge to a codeword. Observations by the inventors show that in the presence of received channel values that target a trapping set, the decoder typically converges very fast (within 10 to 40 cycles) to a stable pseudo-codeword state thereby allowing the re-decoding to be triggered. Accordingly, adding the ability to detect stable states results in a novel process that has improved efficiency since the re-decoding trials can be performed within the normal cycle budget of the decoder.

According to an embodiment of the invention the initial process detects a stable state by monitoring the minimum number of unsatisfied check nodes throughout the decoding. If this number remains stable for a predetermined number of cycles, a stall is declared, which signals the decoder to initiate a new trial. In order to decrease the chance of falsely identifying a stable state, it may also be a condition of the process that the number of unsatisfied check nodes be smaller than a threshold.

Simulations run, by the inventors, in software on a distributed computing platform were performed to assess the general applicability of re-decoding. These simulations bring run on two codes, each having a different rate and a different structure. The first code being from the 10 Gbps Ethernet standard and the second code a Progressive Edge Growth (PEG) construction, with a length of 1008 and rate ½ designed by Xiao-Yu Hu, see for example "Regular and irregular progressive edge-growth Tanner graphs" (IEEE. Trans. Info. Theory, Vol. 51(1), January 2005 pp. 386-398). It is regular in variable node degree, with $d_v=3$.

The behavior of re-decoding trials is controlled by the B sequence and by the trapping set detection parameters, which are the limit on the number of unsatisfied check nodes and the number of stable cycles. The B sequence was optimized manually in this instance by observing the performance of the decoder on a set of recorded frames that failed to decode in a single trial. To simplify the problem, the number of distinct B values was limited to 3. However, it would be evident that the B sequence may also be established through an iterative process wherein a processor driven decoder iterates towards an effective B sequence for a particular code during an initial operation sequence, e.g. training, and that this B sequence is continuously or periodically varied to establish whether an improvement may be made. It would also be evident that the number of values in the B sequence may be varied without departing from the scope of the invention.

For the 10 Gbps Ethernet code, the B sequence selected was $B=((0.75)^1, (0.25)^{20}, (0.125)^{k-21})$, where k is the maximum number of cycles in a re-decoding trial. The last value of 0.125 was chosen intuitively. However, the example of the PEG code shows that it might not be necessary to use lower values at all. For the trapping set detection parameters, the limit on unsatisfied check nodes was set at 30, and the number of stable cycles at 10. Those values were adjusted based on simulation results.

For the PEG code, the B sequence was chosen as $B=((0.75)^1, (0.45)^{20}, (0.2)^{k-21})$, the limit on unsatisfied check nodes was set at 20, and the number of stable cycles at 10. It is interesting to note that even though B remains relatively high, this does not prevent trapping set frames from converging. This is most likely due to the fact that the decoder stops as soon as a codeword is found, and does not require the trajectory to stabilize, which differs from the case of a general optimization problem.

Figure 11:
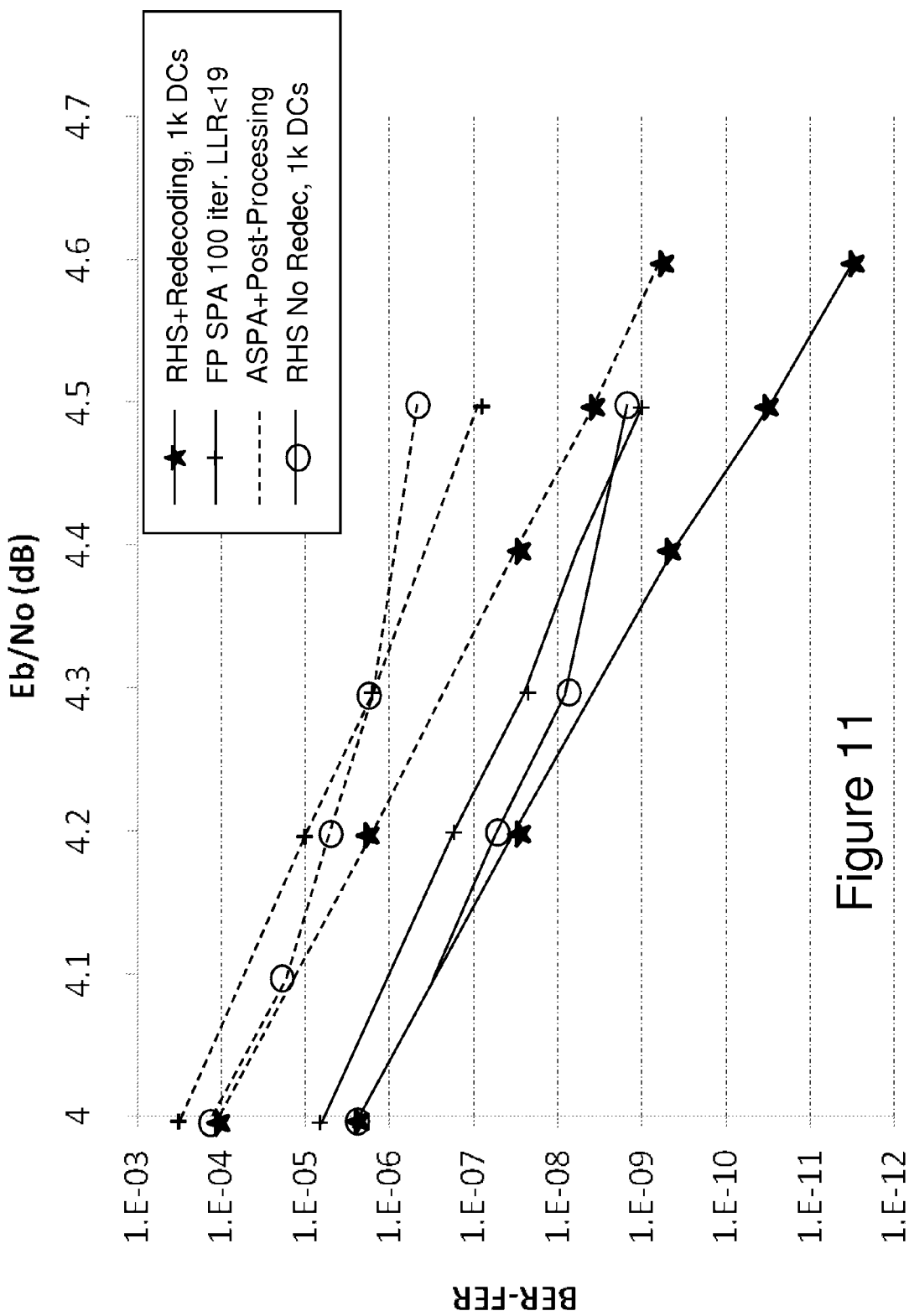
FIG. 11 presents a comparison of results for a decoder for 10 Gbps Ethernet code.

Referring to FIG. 11 there are shown the BER and FER results for the 10 Gbps Ethernet code. It is evident that the RHS+Re-decoding approach according to an embodiment of the invention does not show any noticeable error floor down to a BER of 1.5e-12. Overall, a total of 10 errors were recorded at the SNR 4.6 dB. Of these 9 were undetected errors, and from those 4 were ML errors meaning that a Maximum Likelihood decoder would also have failed on those frames. FIG. 11 also shows the results presented in Ztang et. al. {REQUIRE REFERENCE} for their post-processing technique. Note that the loss with respect to the RHS decoder is due to the underlying belief propagation decoders combined with the chosen iteration limit, and does not represent a limitation of the post-processing algorithm.

Figure 12:
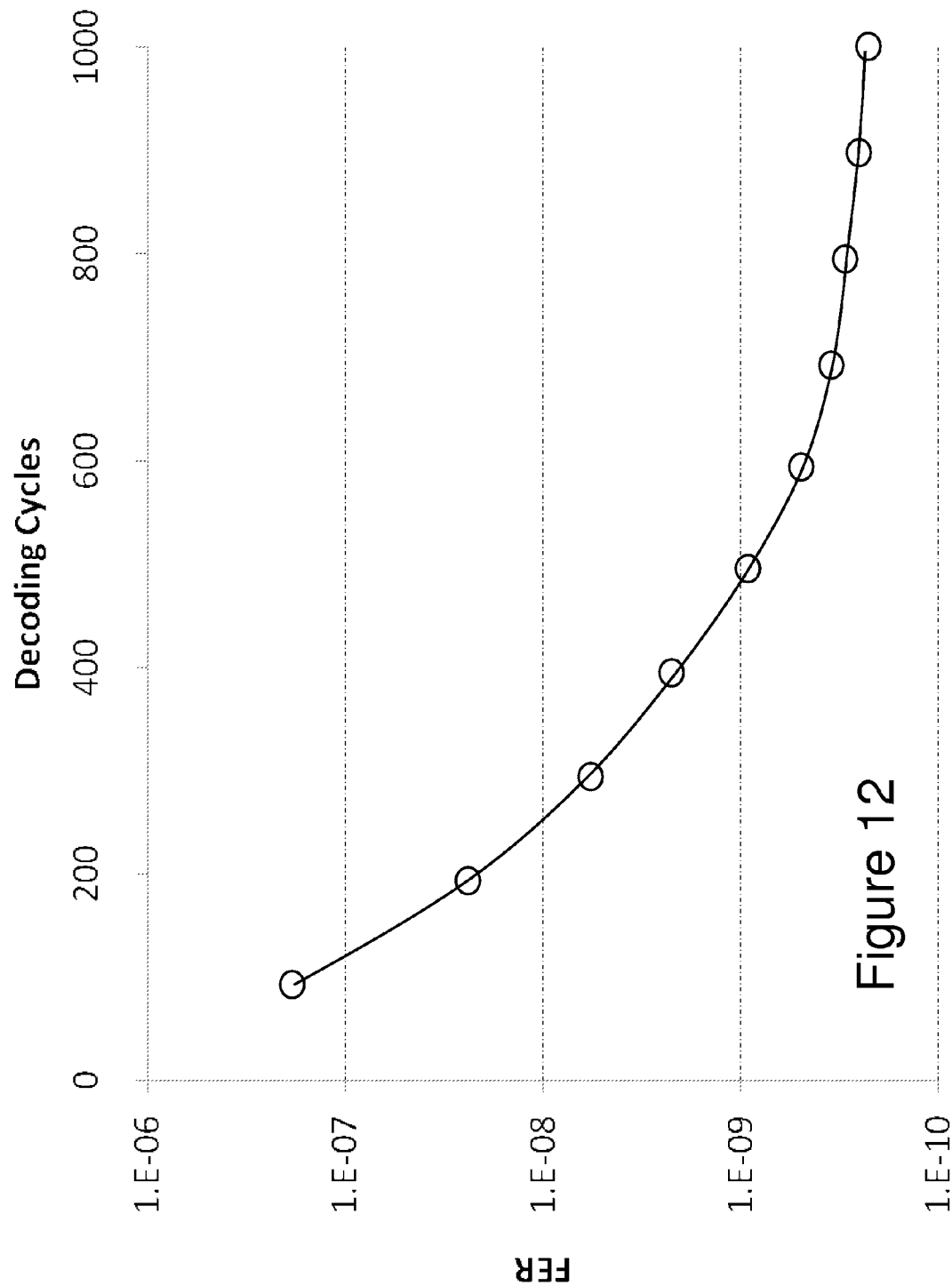
FIG. 12 presents the performance of a decoder with re-decoding according to an embodiment of the invention.

Now referring to FIG. 12 there is shown FER as a function of decoding cycles wherein the codewords that were decoded using re-decoding, the codeword that required the most trials used 23 trials and 594 cycles.

Figure 13:
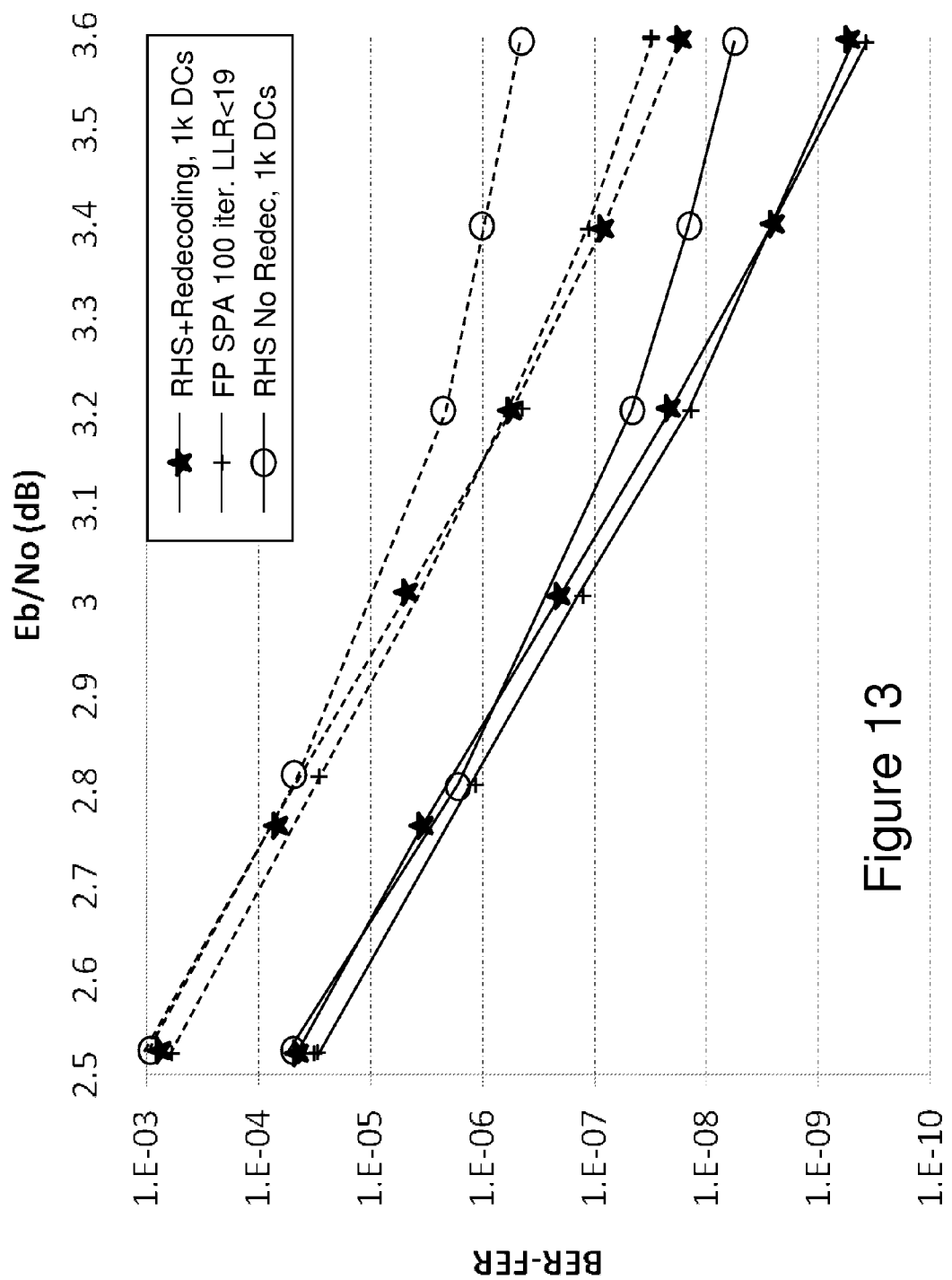
FIG. 13 presents a comparison of results for decoders using the PEG code.

Referring to FIG. 13 there are shown the BER and FER results for the PEG code. The results show that on this code as well, re-decoding can improve the error floor by a significant margin against the prior art RHS technique achieving comparable performance to a fixed point implementation of a Sum-Product Algorithm (SPA). Overall a total of 41 errors were recorded at 4.6 dB, all of which were detected errors. The worst-case for the number of re-decoding trials was 20 trials, corresponding to 654 cycles.

Accordingly, it is evident from the results presented in respect of FIGS. 11 through 13 that the novel re-decoding process results not only improved error noise performance but also in improved efficiency as the results are achieved with a reduced overall processing overhead as the re-decoding trials are performed during the normal cycle budget of a decoder according to the prior art.

Multi-Phase Decoding:

Within the prior art, a few randomized Baseline Profile (BP) algorithms have been proposed. A common occurrence of a BP coding scheme being the H.264/MPEG-4 Advanced Video Coding standard which employs block-oriented motion-compensation-based codecs (developed by the ITU-T Video Coding Experts Group). Within analog decoders randomness occurs naturally as the result of transistor mismatches. In studying the effect of transistor mismatch, Lustenberger and Loeliger in "On mismatch errors in analog-VLSI error correcting decoders" (Proc. ISCAS (4), 2001. pp. 198~201) observed that randomness in the decoding algorithm could yield some gains in error rate. Further Hemati and Yongacoglu, in "On the dynamics of analog min-sum iterative decoders, an analytical approach," (Proc. IEEE Int. Sym. Information Theory, June 2007, pp. 326-330), noted that the dynamic equations of an analog Min-Sum (MS) decoder become singular for codes with cycles, and presented message dithering to resolve the singularity and remove an early error floor. For discrete BP decoders, Yao and Banihashemi in "Decoding Low-Density Parity-Check Codes with Probabilistic Scheduling" (IEEE Comms Letters, Vol. 5(10), pp 414-416), proposed a probabilistic message schedule wherein the choice of message to update is performed randomly according to predefined probabilities derived from an analysis of the Tanner graph. However, the main aim of these algorithms was not to address error floors performance.

When designing improvements to BP algorithms, it can be useful to study the aspects of a code's structure that cause belief propagation algorithms to fail to converge to a codeword. Whether the decoding algorithm converges to a stable state or oscillates, we are interested in characterizing that part of the Tanner graph that remains in error. Trapping sets provide a behavioral definition of this sub-graph. A variable node is said to be eventually correct if there exists an iteration I such that the node's a-posteriori estimate is correct for all decoding iterations i>I. A trapping set is defined as a set of variable nodes that are not eventually correct.

If we denote by T the set of variable nodes that form a trapping set, and use N(X) to mean the set of all nodes in the Tanner graph that are connected to at least one element of set X, i.e. the neighborhood of set X. We will also define the special neighborhood functions $N_E(X)$ and $N_O(X)$ that include only those nodes that have respectively an even and odd number of connections to set X. We will refer to the sub-graph of the Tanner graph induced by T∪N(T) as the trapping set sub-graph.

As the definition of trapping sets is behavioral, it cannot form the basis of a topological characterization of the sub-graph. It has been shown experimentally that a sub-graph structure called an absorbing set represents the dominant trapping sets of several structured codes, including the RS-LDPC code used in the IEEE 802.3an standard which relates to 10 GBASE-T 10 Gbit/s Ethernet over unshielded twisted pair (UTP). Absorbing sets are defined as a set T of variable nodes such that each element of T has more neighbors in $N_E(X)$ than $N_O(X)$. On the binary symmetric channel (BSC), a common communications channel model used in coding theory and information theory, it can be shown that if each variable node in T has either an incorrect prior, or has two more connections to $N_E(X)$ then $N_O(X)$, then there exists a stable state of the absorbing set sub-graph for which the a-posteriori decisions are incorrect. In this stable state, all check nodes in $N_E(X)$ have even parity.

The characterization of a BSC decoder is also useful for considering an AWGN decoder, because it describes the behavior of the AWGN decoder as messages become saturated. It is relatively straightforward to see that if all incoming messages at a node are saturated, then the behavior is identical to a BSC decoder, with the exception that in variable nodes, since the AWGN previously might not be saturated, ties among inputs might be decided against the a-priori hard-decision (unlike the rule of the Gallager-B algorithm). However, this modification has no impact on the stability of absorbing sets as specified above. An important consideration for the analysis that follows is that, if an absorbing set sub-graph is in an incorrect stable state, it is possible given the knowledge of T to correct a node x∈T by changing the parity of some of its neighbors in $N_E(T)$ such that a majority of messages into x are correct. Furthermore, the parity of check nodes in $N_E(T)$ depends on the parity of messages it receives from all its neighboring variable nodes $N(N_E(T))$.

Since the receiver has no prior knowledge of the transmitted codeword, one important measure of the progress of the decoder is the number of satisfied parity constraints, also known as the syndrome weight. If we denote $U_I$ the set of check nodes having odd parity based on the a-posteriori hard decisions at iteration i∈N.

Let $E_I$ be the set of variable nodes that have an erroneous a-posteriori estimate at iteration I. By the behavioral definition of trapping sets, T:=$E_\infty$, i.e., the set of codeword symbols that are not eventually correct. It follows that $N_O(T)=U_\infty$. However, in general the information provided by $U_\infty$ is only that at least one node in T is also in $N(U_\infty)$, because some nodes in T can be only connected to $N_E(T)$.

A dominant portion of the errors of BP algorithms that arise in the error floor region are stable under the decoding algorithm and have the property that the number of unsatisfied check nodes is relatively small. Several algorithms have been proposed to tackle this type of error and they share a common procedure. The BP algorithm is first executed normally, which we will refer to as the first decoding phase. In cases of decoding failure, a second phase is launched that attempts to resolve the failure by first identifying the sets $U_I$ and $N(U_I)$, and performing modifications to variable nodes in $N(U_I)$.

The "Algorithm B" proposed by Vamica and Fossorier, "Improvements in belief-propagation decoding based on averaging information from decoder and correction of clusters of nodes" (IEEE Comm Letters, Vol. 10(12), pp. 846-848), performs a search among $N(U_I)$ to try and correct one node in the trapping set. The efficiency of the search is increased by selecting nodes N∈$N(U_I)$ in order of the reliability of their a-priori information. One node v is selected at each search step, and the a-priori input of v is set to the saturated value opposite of the a-posteriori decision obtained at the end of the first decoding phase. Assuming that v has only one neighbor c∈$U_I$, other a-priori inputs are also modified such that the reliability of the message from c to v is increased. For a code with variable node degree $d_v=3$ such as a Margulis code, this has the effect that if the a-posteriori decision of v was incorrect, then messages from v to N(v)\{c} will be corrected. As a result, only 10 search steps are sufficient to lower the floor of the Margulis code by two orders of magnitude.

Another approach known as post-processing operates directly on the BP messages. Furthermore, all nodes in $N(U_I)$ are modified simultaneously. All messages from $U_I$ to $N(U_I)$ are set at a pre-determined high reliability, and all other messages into $N(U_I)$ are set at a pre-determined low reliability. Those reliability values are chosen such that for all v∈$N(U_I)$, the message from the neighbor c∈$U_I$ (assumed to be unique) determines the sign of all outgoing messages from v to N(v)\{c}. The modification has the effect of introducing new errors, but the algorithm relies on some further iterations of the standard BP algorithm to correct those errors. This was shown experimentally to be very efficient in eliminating decoding failures caused by absorbing sets on the code used in the IEEE 802.3an standard, but the effectiveness on other codes has not been reported.

One approach that does not require the dynamic identification of $U_I$ is the use of a Generalized LDPC (GLDPC) decoding algorithm. A GLDPC decoding graph is constructed from the original LDPC graph by grouping certain parity-check constraints together. The constraints to be grouped are selected based on the characterization of the dominant trapping sets of a specific code. The new GLDPC graph can be designed to increase the pseudo-codeword weights and lower the error floor. Decoding is performed by message passing on the graph, as with the Sum-Product algorithm, but the decoding complexity is increased since the constraint nodes are no longer simple parity checks, but general linear block codes.

Another approach is based on the Augmented BP algorithm by Varnica, Fossier and Kavcic, "Augmented Belief Propagation Decoding of Low-Density Parity Check Codes" (IEEE Trans. Comms Letters, Vol. 55(7), pp 1308-1317). This Augmented BP algorithm attempts to resolve all types of BP decoder failures. It proceeds by selecting a variable node $v \in N(U_O)$, where $U_O$ is the set of unsatisfied check nodes at the end of the first decoding phase, and fixing its input to a saturated LLR +S or −S. For each value, the decoder is run for a predetermined number of iterations. This generates two new sets $U_1$ and $U_2$. The process is repeated for each new set generated, creating a binary tree of decoding attempts. For every split in the tree, a new variable node $v \in N(U_K)$ must be selected, where k is the decoding attempt index. The selection of a node $v \in N(U_K)$ is performed by considering the degree of that node with respect to $U_K$ and the reliability of its input prior. This results in error correction performance within 0.2 dB of ML decoding on a small code, and good error floor gains on the Margulis code.

However, both the hardware and time complexity are high. The number of decoding iterations required by the algorithm is exponential in terms of the number of nodes selected, and each split in the decoding tree requires identifying the new sets $U_K$ and $N(U_K)$, and finding the node with the minimum prior reliability in $N(U_K)$.

To better understand the present invention, we consider a two-phase approach, where in the first phase a standard decoding algorithm is used. This simplifies the problem of finding an improved algorithm, as we are guaranteed that received vectors that were successfully decoded with the standard algorithm remain successful with the new two-phase approach.

A convenient way to illustrate the algorithm is to consider the trajectory followed by the decoder's state. The state can be represented by a vector that contains all incoming messages to variable nodes. Because the codeword space has a lower dimensionality than the decoder's state space, each codeword (and pseudo-codeword) corresponds to a region in the state space.

The decoder defines a gradient over the decoder state-space, and therefore defines associated regions of convergence (ROC) for each codeword region of the state space. In general terms, for received vectors that are outside the ROC corresponding to a codeword, it is desirable to modify the decoder's trajectory so that it reaches that region. This can be achieved by randomizing the decoder's trajectory. The aim is to identify a random operation that can be applied uniformly on all the nodes and that offers a good probability of successful convergence for received vectors that lie outside a codeword ROC. Applying a uniform operation removes the need for identifying the set of unsatisfied check nodes $U_I$ and the related neighborhood $N(U_I)$. Received vectors that fail to be decoded by the standard decoding algorithm in the first phase are attempted again with the present invention using a second phase, which is independent from the first phase. Since the second phase has a random component, it can optionally be split among multiple independent decoding attempts or trials. The second phase lasts until a valid codeword is found, or until the total iteration budget is used up. The trajectory of an iterative belief propagation algorithm can be altered by modifying either the initial state or any subsequent state. This invention can be implemented with a strategy for randomizing the trajectory with the specific intent of avoiding convergence to absorbing sets. Then it can be implemented in a more general randomization scheme of the initial state that has the potential to resolve any failure of the BP decoder.

The invention can be implemented as a modification of a base BP algorithm. A decoding algorithm must also be chosen to perform the first phase of the decoding. The same approach is used for both functions so as not to introduce additional complexity. Any BP algorithm can be used, although the normalized Min-Sum algorithm was used in simulations for its low implementation complexity and good error-correction performance even under low-precision quantization. The normalization was performed by multiplying the minimum values by a constant $\alpha$. The value of this constant is code dependent.

Following the state-space trajectory illustration, it is possible to add a random component to the decoder's trajectory such that given a received vector that lies in the region of convergence of a pseudo-codeword, there is a non-zero probability of converging to a valid codeword. We mentioned above that given a BP algorithm that has converged to an absorbing set stable state, it is possible to correct specific nodes in the absorbing set by altering the parity of some check nodes in $N_E(T)$.

The parity of nodes in $N_E(T)$ is determined by the parity of messages received from the variable node neighborhood $N(N_E(T))$, and therefore the state of the check nodes $N_E(T)$ can be randomized by flipping the sign of outgoing LLR messages in either the check nodes or the variable nodes. An approach that will achieve this consists in randomly flipping outgoing messages on a node-by-node basis, either in the variable nodes or check nodes. A single parameter p controls the probability of flipping messages at a given node. This is implementation is referred to as random sign flip (RSF) in the check nodes (CN) (or in the variable nodes (VN)).

Accordingly we define a CN (VN) update rule wherein we compute outgoing LLR messages using the base algorithm, and with probability p, flip the sign of all outgoing messages and a corresponding VN (CN) update rule that is one of no change.

In the VN version, the action of flipping a node has the consequence of inverting the parity of all neighboring check nodes. In the CN version, check nodes are flipped independently one from another. The nodes to be flipped are selected randomly, and different nodes are flipped at each decoding iteration. The number of variable nodes that are flipped is also random. Finally, all variable nodes are equally likely to be flipped, the operation is not limited to nodes in $N(U_I)$. An attractive aspect of this implementation is that it adds very little hardware complexity to the base BP algorithm. It only requires one random bit per node, and the ability to invert the sign bit of the BP messages. Implementing the check node version of RSF has lower complexity since there are less check nodes than variable nodes. Furthermore, conditionally inverting all output signs in a check node only requires a single 2-input XOR gate (per node), since the inversion can be applied to the total sign bit. Random bits can be generated by simple linear feedback shift registers (LFSR). The LFSR must be composed of several random bits, but the circuit can be shared among a group of nodes.

Another embodiment of the invention, referred to as initial state randomization can be understood as follows. The initial state of the decoding algorithm is derived from the channel soft information and considering that the initial state fully determines the outputs of the BP decoder, it is useful to classify initial states into converging and non-converging states, depending on whether or not a given initial state causes the BP decoder to converge to a valid codeword within the pre-defined iteration limit. Values received from the channel can be expressed as a vector y∈$R^N$ where N is the code length.

For any initial state y in a non-converging region, there exists a translation that will bring it into a converging region using the equation given by Equation (2) below;

$$Y_D = y + D = x + w + D \quad (2)$$

where x∈$\{-1,1\}^N$ and w is the channel noise realization.

Figure 14:
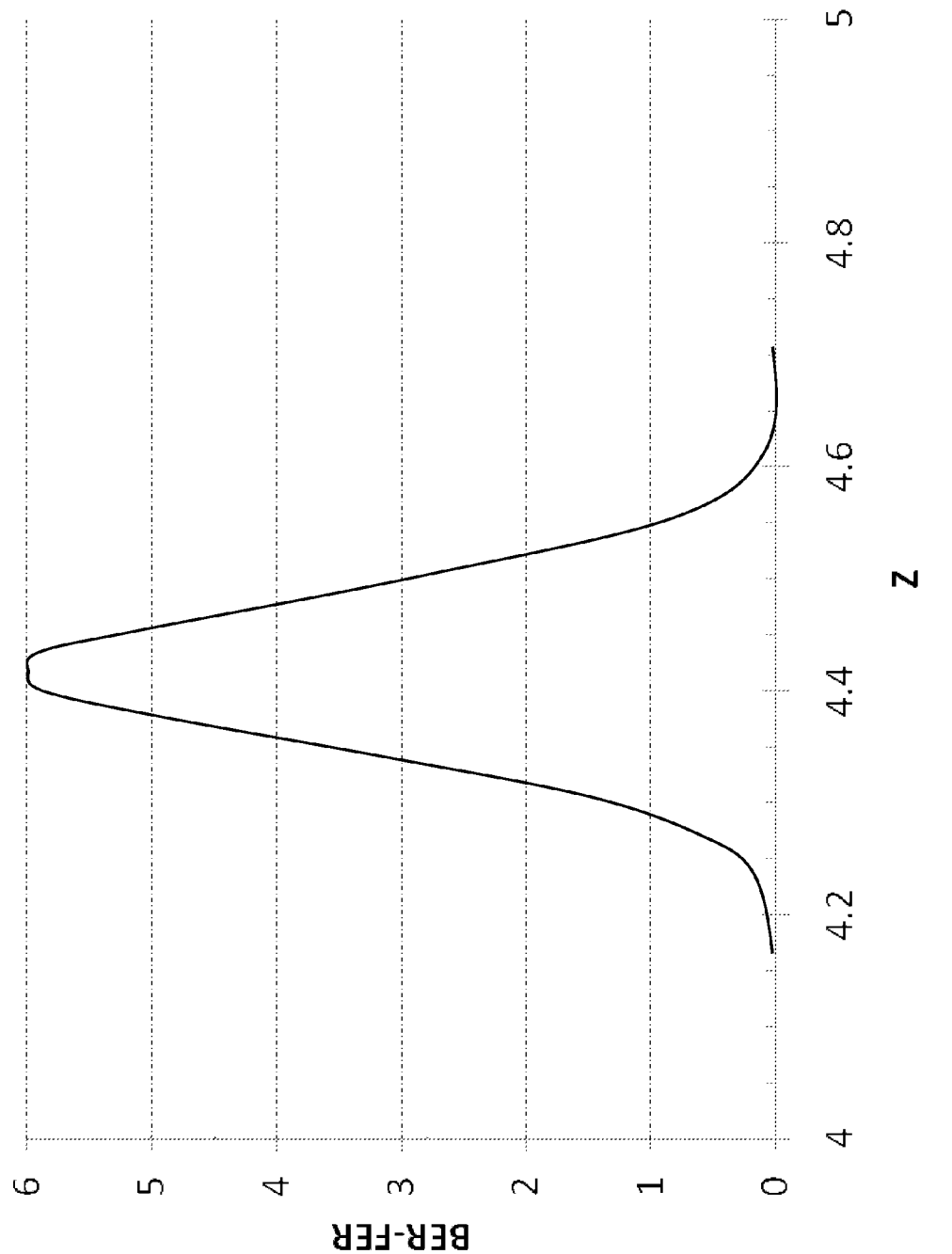
FIG. 14 presents the probability density function of the L2 norm Z of the Gaussian i.i.d offset vector ($Z=\|D\|_2$)

The Random Initial State (RIS) implementation consists in searching for a converging region of the BP decoder close to the received vector, in order to hopefully decode a received vector that cannot be decoded by the standard BP algorithm. The search is performed by adding a random independent and identically distributed (i.i.d.) offset vector D of length N. This provides a simple way to search uniformly around the received vector, namely, if the vector has i.i.d. components, all orientations of the vector in the codeword space are equally likely. This implementation is independent of the base algorithm used, and as such can reasonably be expected to provide decoding gains for any code and any base decoding algorithm. An i.i.d. vector is fully characterized by the probability distribution of its L2-norm. If D has components D≈N$(0, \sigma_d^2)$, the L2 norm $\|D\|_2$ has a scaled Chi distribution (with n degrees of freedom), as shown in FIG. 14 with the parameters used for the RS-LDPC code at 4.2 dB. For large vector length n, this distribution is approximately Gaussian, with mean $\sigma_d \sqrt{n - \frac{1}{2}}$ and variance $\sigma_d^2/2$. If the vector components are instead generated from a uniform distribution, for large n the vector's norm distribution is symmetric, as in the Gaussian case. However, compared to the Gaussian vector, the norm of the Uniform vector has smaller variance for the same mean. Generating pseudo-random numbers from a uniform distribution is less complex than from a Gaussian distribution, which makes the uniform distribution more attractive.

Since only the initial state is randomized, the error rate achieved by RIS decoding is mostly a function of the number of independent decoding trials that are performed. The algorithm has two parameters that affect the success probability of a given trial. The first is the number of iterations per trial (the trial length), which affects the size of the converging regions of the base algorithm, and therefore the probability that $Y_d$ will be inside a converging region. Increasing the trial length reduces the number of trials that can be performed inside a given iteration budget, and therefore there is an optimal trial length. The second parameter that needs to be identified is the variance of the input offset, which determines the distribution of $\|D\|_2$. Both parameters depend on the code, the SNR, and the total iteration budget for Phase-II. The trial length and offset variance were observed to have only weak interdependence, making it possible to optimize each parameter separately.

There is a possibility that the RIS decoder could increase the number of non-ML undetected errors, i.e. for a received vector that is successfully decoded by an ML decoder, RIS decoding would cause the underlying BP decoder to converge to a wrong codeword producing an undetected error. As the decoding performance becomes closer to ML decoding, we can expect the number of undetected errors to grow, recalling that for an ML decoder, all errors are undetected. We would expect the asymptotic performance (in the number of trials) to be bounded away from ML, due to the randomness of the RIS algorithm combined with the fact that the BP decoder, when it converges, is not guaranteed to output the ML estimate. However, this gap with ML could be reduced by recording several distinct convergent outputs of the BP decoder, and performing minimum distance decoding on this list of candidate codewords. This is not considered here given the lack of observed undetected errors. In terms of implementation, the only change that the RIS makes compared to a standard belief propagation approach concerns the inputs, and therefore it can easily be implemented on top of an existing decoder.

Simulations were performed on two codes, the first being a RS-LDPC code of length 2048 and rate 0.84 as adopted in the IEEE 802.3an standard for 10 Gbps Ethernet over CAT6 cables. It is regular with node degrees $d_v=6$ and $d_c=32$. The second code is the (2640, 1320) Margulis code, which is regular with degrees $d_v=3$ and $d_c=6$. Both codes have been widely used for empirical work on LDPC decoding algorithms and have good error correction performance, which makes them good choices as benchmarks. The system model used for simulations includes a random source and an encoder. To obtain results that are as practical as possible, the received values are quantized on 4 bits, and LLR messages inside the decoder are saturated within the demodulation range. The decoder simulated uses a floating-point representation of LLR messages, but since the range is constrained, and the algorithm is Min-Sum, no significant performance differences compared to using an integer representation are expected. Furthermore, when simulating the RIS algorithm, inputs to the decoder are again quantized on 4 bits after applying the random offset. The scaling constant used in the base Normalized Min-Sum algorithm was optimized for each code; α=½ for the RS-LDPC code and α=¾ for the Margulis code.

Figure 15:
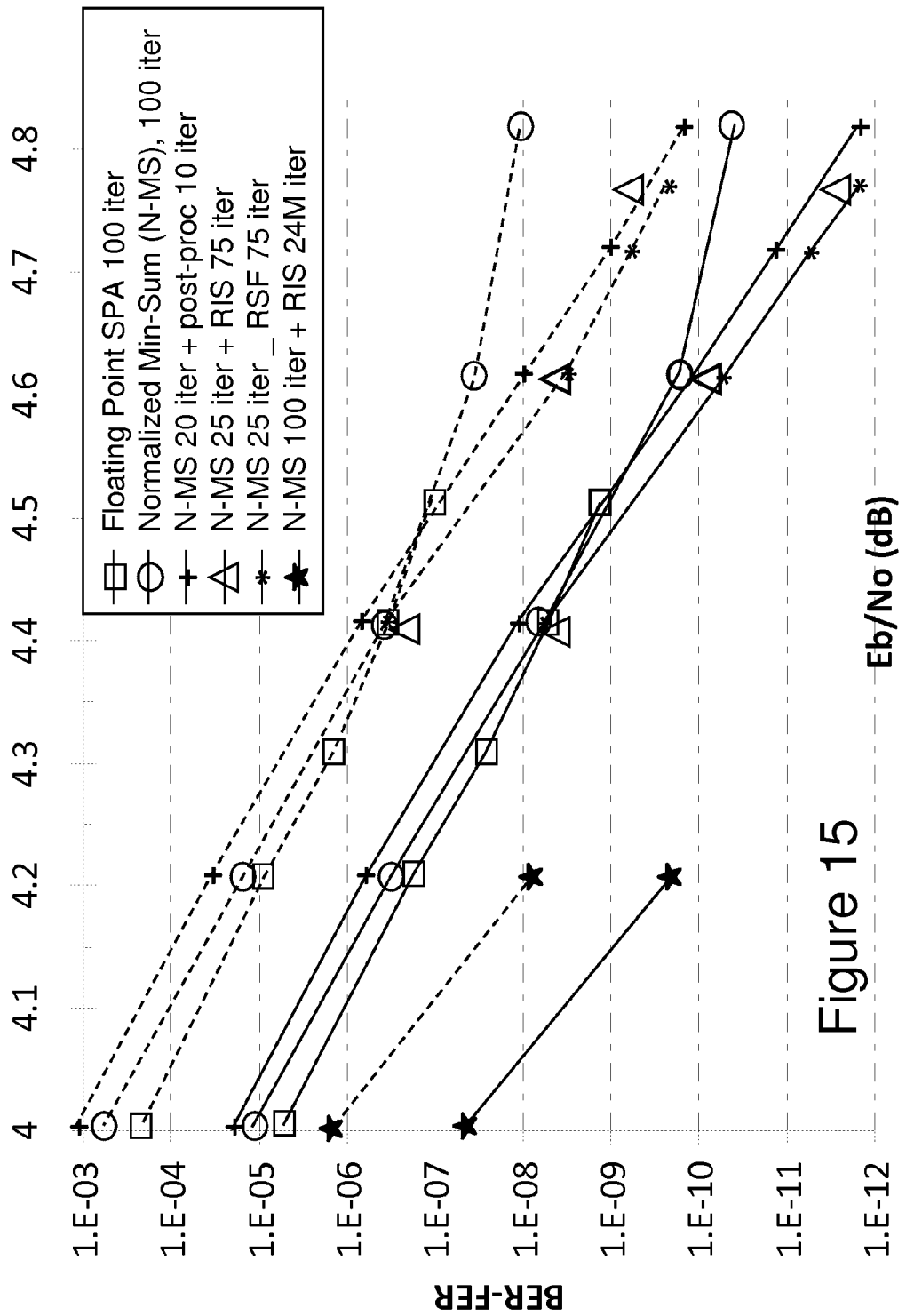
FIG. 15 depicts BER and FER performance of the RS-LDPC code with various decoder implementations.
Figure 16:
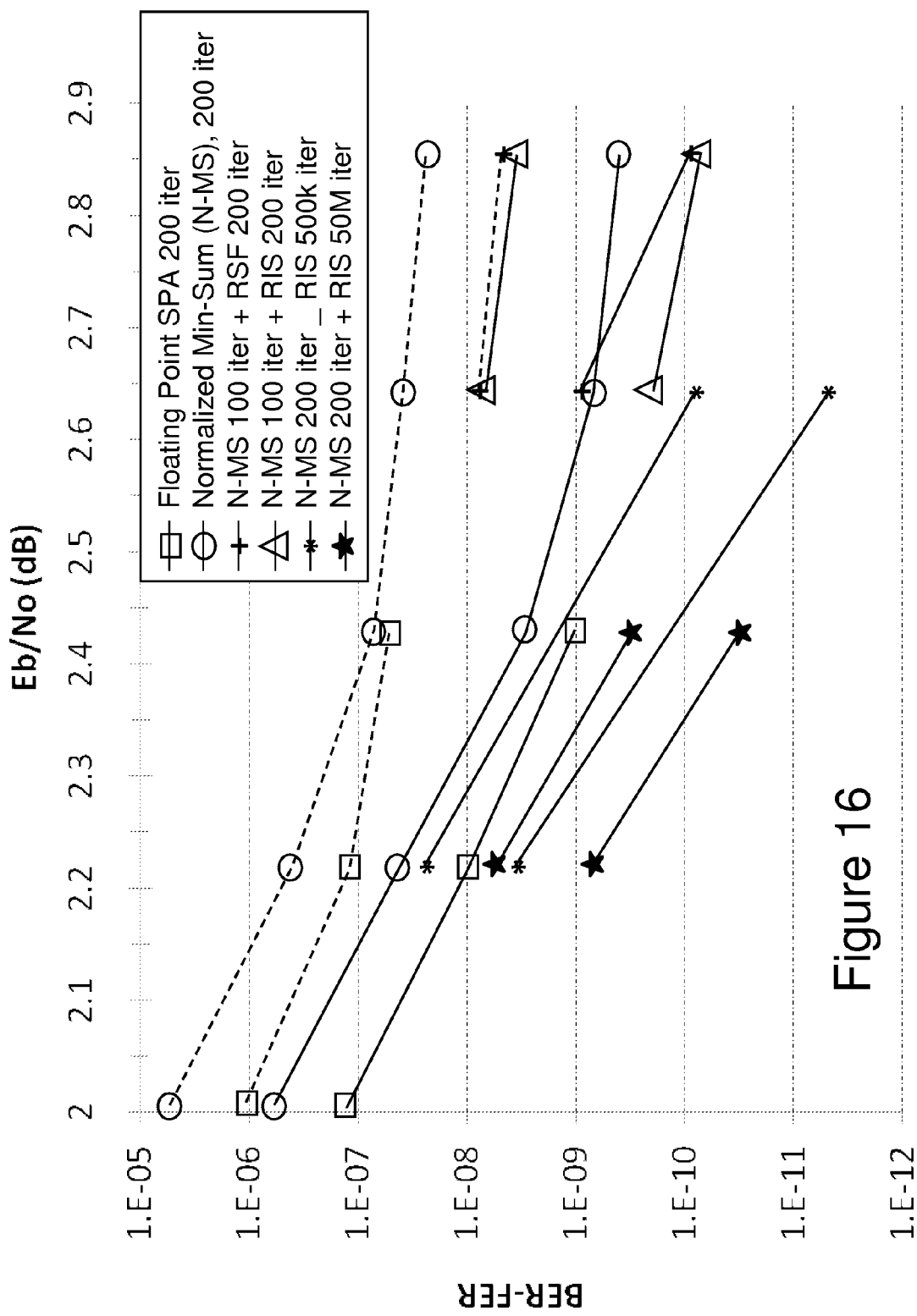
FIG. 16 depicts BER and FER performance of the Margulis code with various decoder implementations.
Figure 17:
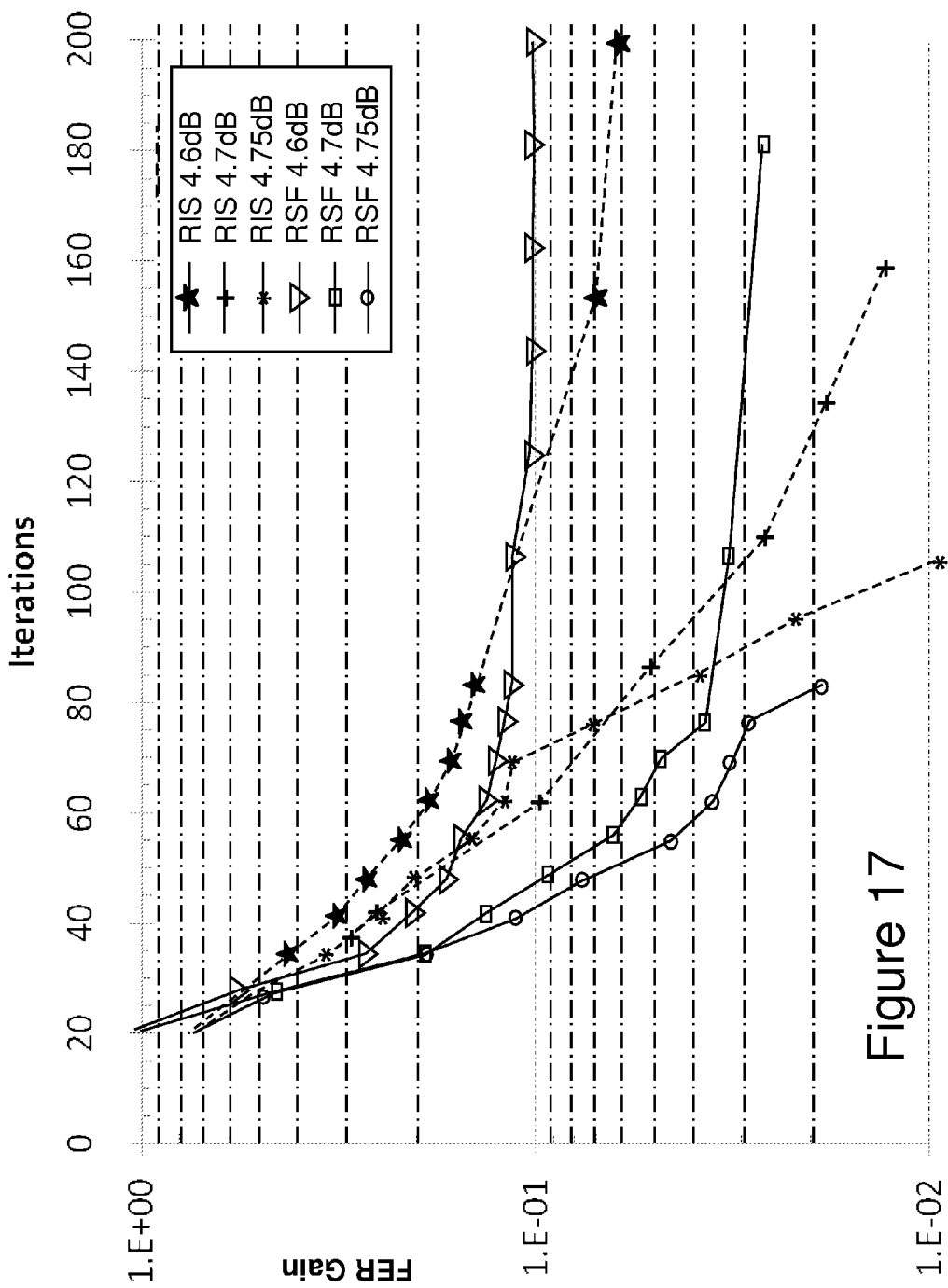
FIG. 17 depicts the FER gain provided by a second phase of a decoder as a function of the number of decoding iterations for the RS-LDPC code.
Figure 18:
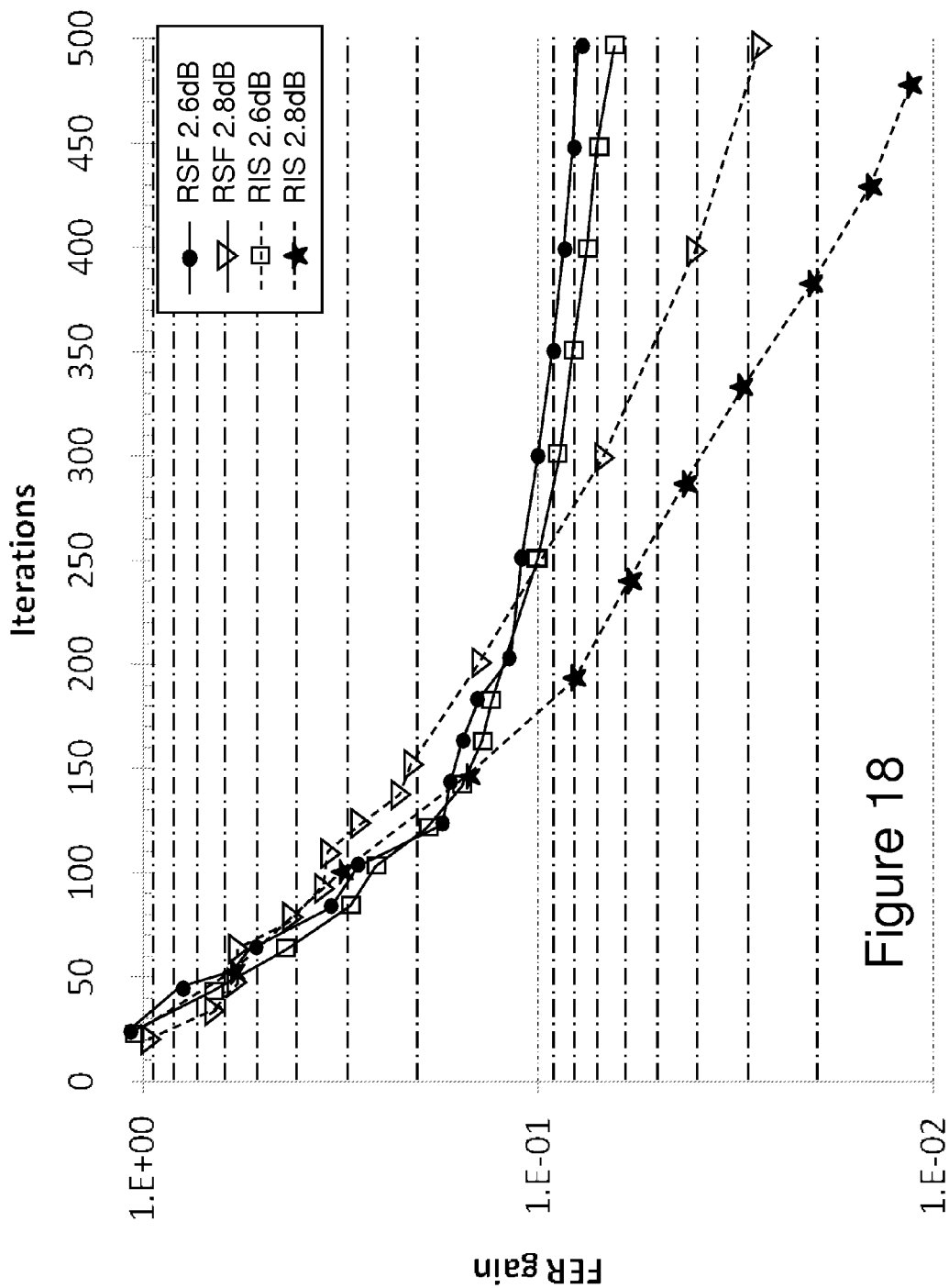
FIG. 18 depicts the FER gain provided by the second phase of a decoder as a function of the number of decoding iterations for Margulis code.
Figure 19:
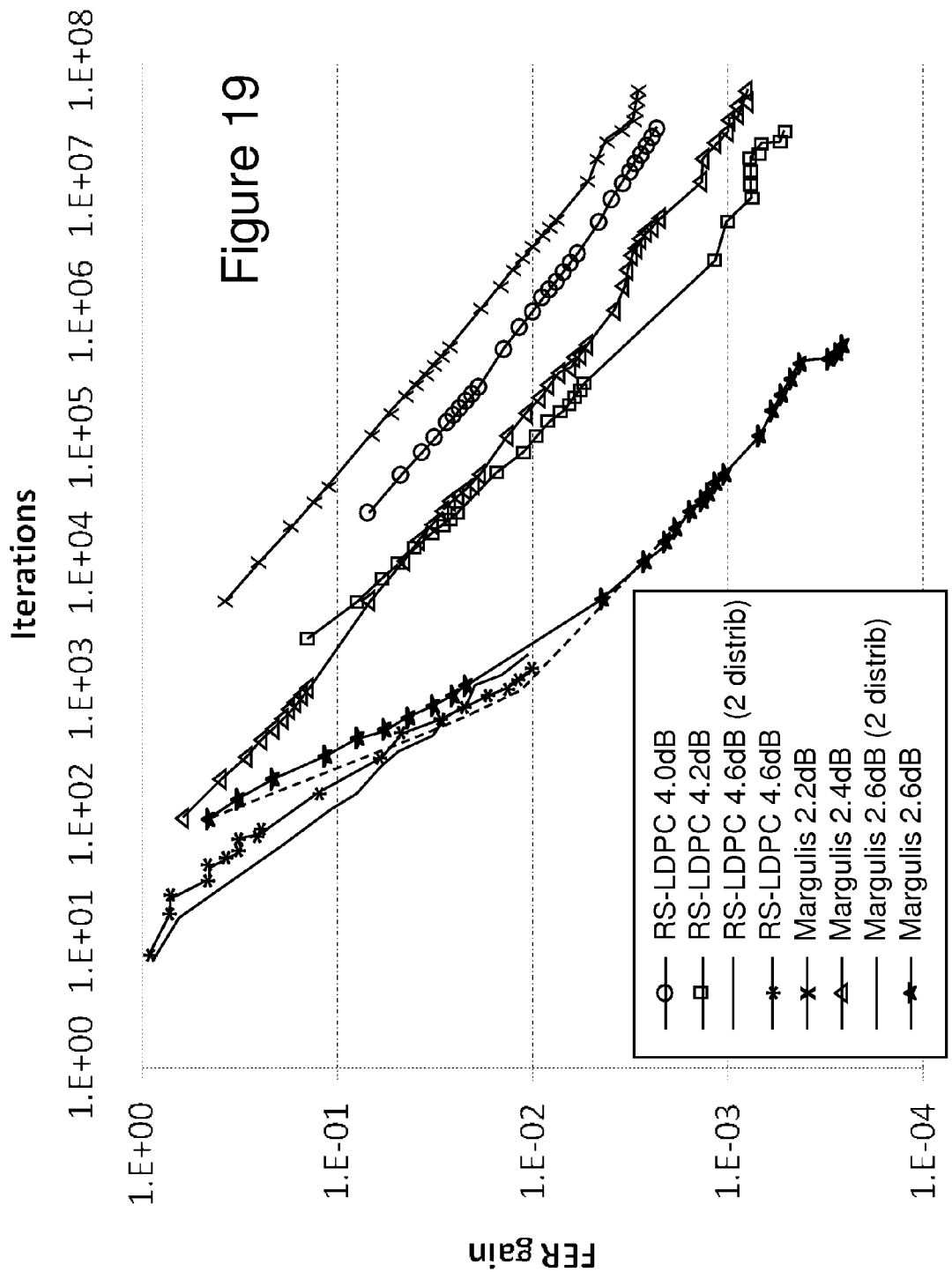
FIG. 19 depicts the FER gain provided by the second phase of a decoder for an exponential growth in the maximum number of decoding iterations.

FIGS. 15 and 16 depict the calculated BER and FER as a function of SNR for the RS-LDPC and the Margulis code, respectively. Note that the results shown for Normalized Min-Sum cannot be significantly improved by increasing the iteration limit. For both codes, undetected error events are very rare under BP decoding. Referring to Tables 3 and 4 the numerical details of the observations are presented. Note that when a received vector results in an undetected error in the first phase, it cannot be passed on to the second phase. In the second phase of the decoding, undetected errors were never recorded. The last column in Tables 3 and 4 indicates the number of error events recorded for the best result appearing in FIGS. 15 and 16 at that SNR, irrespective of the decoding algorithm. The lowest BER points were obtained using large parallel software simulations. Results at a BER of 1×10-12 require approximately 100,000 CPU-core_hours. FIGS. 17, 18 and 19 present the FER on received vectors that failed to be decoded in the first phase, or in other words, the FER gain of the second phase. The FER gain is shown for a fixed SNR, in terms of the iteration budget. FIGS. 17 and 18 focus on small iteration limits, whilst FIG. 19 presents the FER of the RIS implementation for large iteration limits.

TABLE 3

Simulation Results for RSF Implementation with RS-LDPC Code

| Simulation | Errors After First Phase | Undetected in the First Phase | Errors After Best Second Phase |
|---|---|---|---|
| RS-LDPC, 4.0 dB | 102,998 | 1 | 223 |
| RS-LDPC, 4.2 dB | 73,788 | 7 | 38 |
| RS-LDPC, 4.6 dB | 1,050 | 1 | 115 |
| RS-LDPC, 4.7 dB | 456 | 1 | 17 |
| RS-LDPC, 4.75 dB | 304 | 0 | 6 |

TABLE 4

Simulation Results for RSF Implementation with Margulis Code

| Simulation | Errors After First Phase | Undetected in the First Phase | Errors After Best Second Phase |
| --- | --- | --- | --- |
| Margulis, 2.2 dB | 10,132 | 0 | 29 |
| Margulis, 2.4 dB | 33,305 | 0 | 9 |
| Margulis, 2.6 dB | 30,045 | 0 | 8 |
| Margulis, 2.8 dB | 1,005 | 0 | 80 |

The simulation results show that with the RSF implementation, it is not advantageous to split the second phase into multiple decoding trials. Therefore the only remaining parameter to be selected is the message flip probability. This parameter was optimized numerically on both codes at various SNRs. Results show that for each code, the optimal parameter value is constant with respect to SNR (up to the precision of the optimization). For the RS-LDPC code, this value was found to be p=0.0023 when the randomization is performed in the variable nodes, and p=0.07 in the check nodes, whilst for the Margulis code the values are p=0.0022 for the variable node variant and p=0.011 for the check node variant. Finally, performing the sign flip operation in the check nodes was found to achieve the same performance as in the variable nodes.

The BER and FER performance of the algorithm on the RS-LDPC code are shown in FIG. 18. Despite the algorithm's simplicity, 75 iterations of the second phase are sufficient to get a good slope and reach the BER of 1×10-12 required by the 10 Gbps Ethernet standard. Furthermore, FIG. 17 shows that the efficiency of the FER gain in terms of the maximum number of iterations increases with SNR. Therefore, the decoding performance is expected to be able to reach lower error rates without any increase in the iteration limit. The "post-processing" approach is also shown in FIG. 15 for comparison. In terms of maximum latency, the "post-processing" solution is faster, but the high-level complexity analysis suggests that RSF has a lower hardware complexity, especially since the "post-processing" approach performs its operations in the variable nodes, which are in greater number than check nodes. For example, the high rate RS-LDPC code considered here has 2048 variable nodes and 384 check nodes. Also note that from FIG. 17, the number of second phase iterations of RSF can be reduced to 50 without much loss in frame error rate. Compared to the RIS implementation, FIG. 17 shows that RSF achieves lower error rates for small iteration budgets.

On the Margulis code, RSF provides a FER gain of about 1 order of magnitude, but, as can be seen in FIG. 18, its efficiency does not increase much as SNR goes from 2.6 dB to 2.8 dB. For small iteration budgets, the error rates of RSF are similar to those obtained using RIS, although the efficiency of RIS does increase with SNR. Finally, FIGS. 17 and 18 show that the FER-gain provided by RSF stops improving significantly after a certain number of iterations, suggesting that, as expected, its effectiveness is limited to Phase-I failures caused by absorbing sets. The results show that the RSF implementation is less effective on the Margulis code. The effectiveness of RSF on a given code can be split in two parts. First, the probability that the posterior of all variable nodes in the absorbing set T become correct, as a function of the check node flipping probability p, and second, the highest value of p that can be used without preventing the iterative process from converging.

Instead of analyzing the probability that all nodes in T are corrected, for a rough comparison between two code graphs we can simplify the discussion by considering the dominant absorbing sets, and studying the probability of observing some correct messages from, $T \rightarrow N_E(T)$ noting that such an event increases the probability of observing correct messages in the next iteration. This probability can be calculated using straightforward combinatorial arguments by assuming that all messages into T are close to saturation, with messages $N_O(T) \rightarrow T$, are all correct and messages $N_E(T) \rightarrow T$ all incorrect, and from the knowledge of the topology of the dominant absorbing sets. Dominant absorbing sets on both codes have been well studied for the Margulis code and for the RS-LDPC code. Such calculations show that despite the lower variable node degree of the Margulis code ($d_v=3$ versus $d_v=6$ for the RS-LDPC code), the probability of observing correct messages $T \rightarrow N_E(T)$ is a similar function of p for both codes, essentially because in the case of the Margulis code, only a few variable nodes in T are connected to $N_O(T)$, while for the RS-LDPC code, all variable nodes in T are connected once to $N_O(T)$.

As a result, the relative efficiency of RSF on these two codes seems to mostly depend on the value of p. The optimization results stated previously indicate that for the Margulis code, p cannot be as high as for the RS-LDPC code. This is most likely because of the lower variable node degree, since a lower variable node degree increases the likelihood that a sign flip in a variable node input will cause a sign flip in the variable node's outputs, and therefore, for a given p, increases the average amount of incorrect messages that are propagated in the Tanner graph.

If the maximum number of iterations is high, the RIS implementation can dramatically improve the error rate of a standard BP algorithm, both in the error floor and the waterfall regions. At the same time, depending on the SNR and on the specific iteration budget, the simulation results show that the average time complexity can be quite low, and even essentially equal to the average time complexity of the base BP algorithm. A second phase that uses the RIS implementation always consists of multiple decoding trials, since only the initial state is randomized. The algorithm has two parameters that must be tuned, namely the trial length and the variance of the random input offset. As already mentioned above, the trial length and offset variance were observed to have only weak interdependence, and each can be optimized separately without significantly affecting the performance. In general, as SNR increases, the BP algorithm converges faster, and the optimal trial length decreases. The results presented use a different trial length for each SNR.

For both codes, very similar results were obtained whether a Gaussian or uniform distribution was chosen for the input offset. Up to the precision of the numerical optimization, the optimal distributions in each case corresponded to an equal variance. Note that for i.i.d. vectors $X=[X_1, X_2, \ldots, X_n]$, $X_i \sim N(0, \sigma^2)$, and $Y=[Y_1, 2, \ldots, Y_n]$, $Y_i \sim U(-a,a)$, equal variances $VAR(X_i)=VAR(Y_i)$ imply that the L2-norms have equal means $E(\|X\|_2)=E(\|Y\|_2)$, since $E(X_2)=VAR(X)$ and $E(Y_2)=VAR(Y)$.

Considering, the relationship between the optimal $\sigma_d^2$ and the iteration limit then within the waterfall region, it was observed to slightly increase with the iteration limit, meaning that with a bigger iteration budget, it is advantageous to search farther away from the received vector. Interestingly, the trend for $\sigma_d^2$ differs in the error floor region. With a small iteration budget, the optimal value is much bigger than in the waterfall region. For big iteration budgets, the value is smaller and comparable with the values observed in the waterfall region. These results outline two different failure modes for the base BP decoder, characterized by different optimal $\sigma_d^2$ values. This observation can be linked to prior art where dominant BP failures in the waterfall region were observed to correspond to unstable states of the decoder, while error floor failures, to correspond to stable states with saturated messages. In the error floor region, as the iteration budget for 1 second phase is increased and the FER gain improves, the "error floor" failure mode ceases to be dominant and the optimal $\sigma_d^2$ eventually becomes similar to the optimal values of the waterfall region. Results show that if the iteration budget is large, $\sigma_d^2$ can be set to the value corresponding to "waterfall" failures without any loss in error correction performance. On the other hand, using the "error floor" $\sigma_d^2$ value as the unique value results in significant degradation for higher iteration budgets.

The BER and FER performance on the RS-LDPC code is shown in FIG. 15 and on the Margulis code, in FIG. 16. On the RS-LDPC code, the RIS implementation achieves approximately the same performance as RSF for small iteration budgets. Using a budget of $2.4 \times 10^7$ iterations, a decoding gain of 0.35 dB is obtained at a FER of $2.3 \times 10^{-9}$ with respect to RSF, and 0.40 dB with respect to the decoder of Zhang et al. At this SNR (4.2 dB) and for this iteration budget, the increase in average time complexity is only 3.5%. However, at 4.0 dB, the complexity increase is 528%. To maintain a fixed complexity increase at all SNRs, the iteration budget would need to be adjusted based on the SNR.

Figure 20:
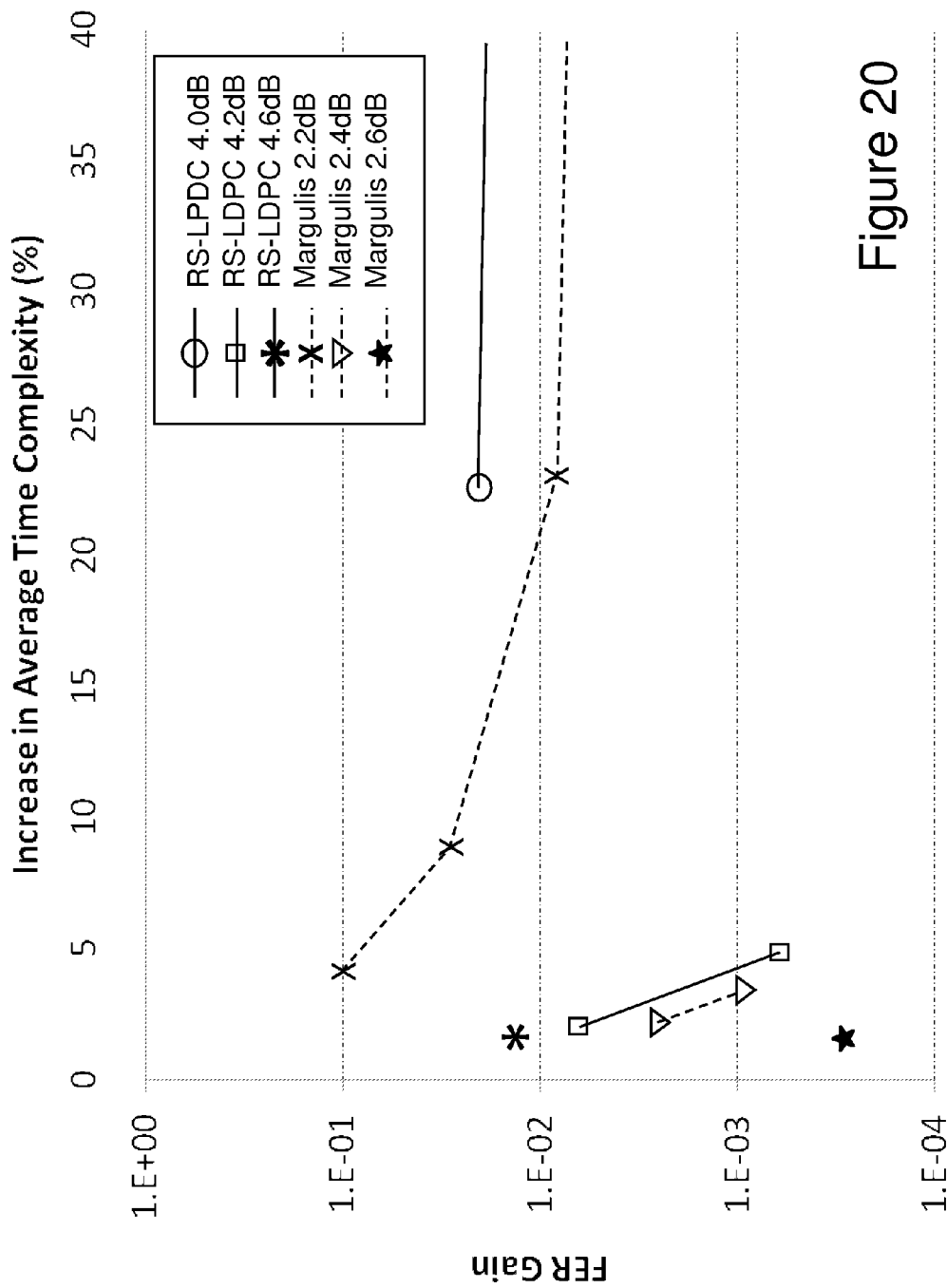
FIG. 20 depicts the FER gain provided by the second phase of a decoder using RIS implementation in terms of the increase in average decoding time over the phase one of the decoder alone.

On the Margulis code, the FER gain provided by RIS is limited when the iteration budget is small (200 iterations), but high error rate gains are possible once the budget increases. With a budget of $5 \times 10^7$ iterations, at 2.4 dB a FER gain of three orders of magnitude is obtained, while the average time complexity increase is 2%. The highest FER gain that was simulated is $2.7 \times 10^{-4}$. FIG. 19 shows the FER gain obtained for each code as a function of the iteration budget, for various SNRs. For SNRs in the floor region, two curves are shown. One corresponds to a decoder that uses two $\sigma_d^2$ values, switching from the larger to the smaller one after a predetermined number of trials. The other uses a single value for $\sigma_d^2$. For both codes, the FER gain efficiency increases with SNR. This increase in efficiency (combined with some improvement in the first phase FER) results in a decrease of the average time overhead as the SNR increases while the iteration budget remains constant, as in the examples above. For each scenario in FIG. 19, the cost of the FER gains in terms of the average time complexity overhead is shown in FIG. 20. At medium to high SNRs, significant gains can be obtained with close to no overhead.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method comprising:
   providing a decoder for decoding received digital data according to a decoding process comprising a plurality of processing nodes, wherein
   at least one of:
   (A) the decoder further comprises linking a common control line to a predetermined portion of the plurality of processing nodes wherein each processing node of the plurality of processing nodes comprises at least a control port coupled to the common control line for receiving a control message, and transmitting the control message on the common control line wherein the width of a pulse transmitted is modulated in dependence with a magnitude associated with the control message;
   (B) the decoding process comprises estimating a probability associated with a predetermined portion of the decoding process in dependence upon the states of a predetermined subset of the plurality of processing nodes and a current belief relating to the decoding process;
   (C) the decoder further comprises providing a random number generator and executing a predetermined portion of the decoding process multiple times on the same received digital data wherein each execution is performed with a different seed for the random number generator;
   (D) the decoder further comprises providing a second decoder comprising a component to randomize the decoding trajectory of the second decoder wherein digital content is parsed to the second decoder upon determining that the decoder has failed to decode the received digital data, the digital content being one of the decoded result of the decoder and the received digital data;
   (E) the decoder further comprises providing a counter forming a predetermined portion of the decoder and operating the counter at a first clock rate, the first clock rate being at a higher clock rate than a second clock rate relating to the rest of the decoder;
   (F) the decoder further comprises providing a variable node as part of the decoder, providing a check node as cart of the decoder, providing an edge linking the variable node and the check node and providing a clock having a first clock and a second clock rate wherein the clock is coupled to the variable node and the one of the first clock rate and second clock rate for the clock is established in dependence upon a transition relating to the edge; and
   (G) the decoder further comprises a plurality of check nodes forming a first predetermined portion of the plurality of processing nodes, a plurality of variable nodes forming a second predetermined portion of the plurality of processing nodes, and the decoding process comprises passing a current belief and information relating to the state of the plurality of processing nodes to an estimator to estimate a probability, delaying a parity check determination relating to the plurality of check nodes, the delay being determined in dependence upon at least the states of the plurality of variable nodes, and performing a parity check operation relating to the plurality of check nodes, the parity check operation made in dependence upon the level of agreement of the variable nodes.

2. The method according to claim 1 further comprising;
   providing a plurality of check nodes forming a first predetermined portion of the plurality of processing nodes;
   providing a plurality of variable nodes forming a second predetermined portion of the plurality of processing nodes; and
   determining a parity check relating to a predetermined subset of the plurality of check nodes in dependence upon a level of agreement between a predetermined subset of the plurality of variable nodes.

3. The method according to claim 1 further comprising;
   providing a plurality of check nodes forming a first predetermined portion of the plurality of processing nodes;
   providing a plurality of variable nodes forming a second predetermined portion of the plurality of processing nodes; and delaying a parity check determination relating to the plurality of check nodes, the delay being determined in dependence upon at least the states of the plurality of variable nodes.

4. A device comprising:
a decoder for decoding received digital data according to a decoding process comprising a plurality of processing nodes, the decoder comprising;
at least one of:
(A) a common control line coupled to a predetermined portion of the plurality of processing nodes, each processing node of the plurality of processing nodes comprising at least a control port coupled to the common control line for receiving a control message, and a transmitter for transmitting the control message on the common control line wherein the width of a pulse transmitted is modulated in dependence with a magnitude associated with the control message;
(B) an estimator for estimating a probability associated with a predetermined portion of the decoding process in dependence upon the states of a predetermined subset of the plurality of processing nodes and a current belief relating to the decoding process,
(C) a random number generator; and multiple executions of a predetermined portion of the decoding process multiple times on the same received digital data, each execution being performed with a different seed for the random number generator; and
(D) a second decoder comprising a component to randomize the decoding trajectory of the second decoder; wherein digital content is parsed to the second decoder upon determining that the decoder has failed to decode the received digital data, the digital content being one of the decoded result of the decoder and the received digital data.

5. The device according to claim 4 further comprising;
a plurality of check nodes forming a first predetermined portion of the plurality of processing nodes;
a plurality of variable nodes forming a second predetermined portion of the plurality of processing nodes; and
a parity checker for determining a parity check relating to a predetermined subset of the plurality of check nodes in dependence upon a level of agreement between a predetermined subset of the plurality of variable nodes.

6. The device according to claim 4 further comprising;
a plurality of check nodes forming a first predetermined portion of the plurality of processing nodes;
a plurality of variable nodes forming a second predetermined portion of the plurality of processing nodes; and
a delay circuit for delaying a parity check determination relating to the plurality of check nodes, the delay being determined in dependence upon at least the states of the plurality of variable nodes.

7. The device according to claim 4 further comprising;
a counter forming a predetermined portion of the decoder; wherein
the counter is operated at a first clock rate, the first clock rate being at a higher clock rate than a second clock rate relating to the rest of the decoder.

8. The device according to claim 4 further comprising;
a variable node as part of the decoder;
a check node as part of the decoder;
an edge linking the variable node and the check node;
a clock generator for providing a clock having a first clock rate and a second clock rate to the variable node, the one of the first clock rate and second clock rate for the clock being determined in dependence upon a transition relating to the edge.

9. The device according to claim 4 wherein,
a plurality of check nodes forming a first predetermined portion of the plurality of processing nodes;
a plurality of variable nodes forming a second predetermined portion of the plurality of processing nodes;
an estimator for generating an estimate a probability in dependence upon a current belief and information relating to the state of the plurality of processing nodes;
a delay circuit for delaying a parity check determination relating to the plurality of check nodes, the delay being determined in dependence upon at least the states of the plurality of variable nodes; and
a parity checker for performing a parity check operation relating to the plurality of check nodes in dependence upon the level of agreement of the variable nodes.

10. A device comprising:
a decoder for decoding received digital data according to a decoding process comprising a plurality of processing nodes, the decoder comprising;
at least one of:
(A) a counter forming a predetermined portion of the decoder, wherein the counter is operated at a first clock rate, the first clock rate being at a higher clock rate than a second clock rate relating to the rest of the decoder;
(B) a variable node as part of the decoder, a check node as part of the decoder, an edge linking the variable node and the check node, and a clock generator coupled to the variable node for providing a clock having a first clock rate and a second clock rate, the one of the first clock rate and second clock rate being determined in dependence upon a transition relating to the edge; and
(C) a plurality of check nodes forming a first predetermined portion of the plurality of processing nodes, a plurality of variable nodes forming a second predetermined portion of the plurality of processing nodes, an estimator for generating an estimate a probability in dependence upon a current belief and information relating to the state of the plurality of processing nodes, a delay circuit for delaying a parity check determination relating to the plurality of check nodes, the delay being determined in dependence upon at least the states of the plurality of variable nodes, and a parity checker for performing a parity check operation relating to the plurality of check nodes in dependence upon the level of agreement of the variable nodes.

11. The device according to claim 10 further comprising;
a common control line coupled to a predetermined portion of the plurality of processing nodes, each processing node of the plurality of processing nodes comprising at least a control port coupled to the common control line for receiving a control message; and
a transmitter for transmitting the control message on the common control line wherein the width of a pulse transmitted is modulated in dependence with a magnitude associated with the control message.

12. The device according to claim 10 further comprising;
an estimator for estimating a probability associated with a predetermined portion of the decoding process in dependence upon the states of a predetermined subset of the plurality of processing nodes and a current belief relating to the decoding process.

13. The device according to claim 10 further comprising;
a plurality of check nodes forming a first predetermined portion of the plurality of processing nodes;
a plurality of variable nodes forming a second predetermined portion of the plurality of processing nodes; and
a parity checker for determining a parity check relating to a predetermined subset of the plurality of check nodes in dependence upon a level of agreement between a predetermined subset of the plurality of variable nodes.

14. The device according to claim 10 further comprising;
a plurality of check nodes forming a first predetermined portion of the plurality of processing nodes;
a plurality of variable nodes forming a second predetermined portion of the plurality of processing nodes; and
a delay circuit for delaying a parity check determination relating to the plurality of check nodes, the delay being determined in dependence upon at least the states of the plurality of variable nodes.

15. The device according to claim 10 further comprising;
a random number generator; and
multiple executions of a predetermined portion of the decoding process multiple times on the same received digital data, each execution being performed with a different seed for the random number generator.

16. The device according to claim 10 further comprising;
a second decoder comprising a component to randomize the decoding trajectory of the second decoder; wherein
digital content is parsed to the second decoder upon determining that the decoder has failed to decode the received digital data, the digital content being one of the decoded result of the decoder and the received digital data.

* * * * *